(12) United States Patent
Colinge et al.

(10) Patent No.: US 10,964,691 B2
(45) Date of Patent: Mar. 30, 2021

(54) METHOD FOR MANUFACTURING MONOLITHIC THREE-DIMENSIONAL (3D) INTEGRATED CIRCUITS

(71) Applicant: Taiwan Semiconductor Manufacturing Co., Ltd., Hsin-Chu (TW)

(72) Inventors: Jean-Pierre Colinge, Hsinchu (TW); Carlos H. Diaz, Mountain View, CA (US); Ta-Pen Guo, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/559,951

(22) Filed: Sep. 4, 2019

(65) Prior Publication Data

US 2019/0393215 A1    Dec. 26, 2019

Related U.S. Application Data

(62) Division of application No. 15/633,016, filed on Jun. 26, 2017, now Pat. No. 10,559,563.

(51) Int. Cl.
  *H01L 21/74*   (2006.01)
  *H01L 27/06*   (2006.01)
  (Continued)

(52) U.S. Cl.
  CPC .... *H01L 27/0688* (2013.01); *H01L 21/30604* (2013.01); *H01L 21/324* (2013.01);
  (Continued)

(58) Field of Classification Search
  None
  See application file for complete search history.

(56) References Cited

U.S. PATENT DOCUMENTS

| 5,744,827 A | 4/1998 | Jeong et al. |
| 7,759,755 B2 | 7/2010 | Adkisson et al. |
| (Continued) | | |

FOREIGN PATENT DOCUMENTS

| JP | 2013183073 A | 9/2013 |
| KR | 100749263 A | 8/2007 |
| WO | 2016024946 A1 | 2/2016 |

OTHER PUBLICATIONS

Heiman, D. "Photoluminescence Spectroscopy." Physics U600, Adv Lab I—Physics of Waves and Optics—Summer 2004, Northeastern University, Jun. 1, 2004.
(Continued)

*Primary Examiner* — Joseph C. Nicely
*Assistant Examiner* — Lamont B Koo
(74) *Attorney, Agent, or Firm* — Eschweiler & Potashnik, LLC

(57) ABSTRACT

A method for manufacturing a monolithic three-dimensional (3D) integrated circuit (IC) with junctionless semiconductor devices (JSDs) is provided. A first interlayer dielectric (ILD) layer is formed over a semiconductor substrate, while also forming first vias and first interconnect wires alternatingly stacked in the first ILD layer. A first doping-type layer and a second doping-type layer are transferred to a top surface of the first ILD layer. The first and second doping-type layers are stacked and are semiconductor materials with opposite doping types. The first and second doping-type layers are patterned to form a first doping-type wire and a second doping-type wire overlying the first doping-type wire. A gate electrode is formed straddling the first and second doping-type wires. The gate electrode and the first and second doping-type wires at least partially define a JSD.

20 Claims, 21 Drawing Sheets

(51) Int. Cl.

| | | |
|---|---|---|
| H01L 23/522 | (2006.01) | |
| H01L 23/528 | (2006.01) | |
| H01L 21/8234 | (2006.01) | |
| H01L 21/683 | (2006.01) | |
| H01L 21/306 | (2006.01) | |
| H01L 21/324 | (2006.01) | |
| H01L 29/08 | (2006.01) | |
| H01L 21/822 | (2006.01) | |
| H01L 29/06 | (2006.01) | |
| H01L 29/423 | (2006.01) | |
| H01L 29/786 | (2006.01) | |
| H01L 29/78 | (2006.01) | |
| H01L 21/8238 | (2006.01) | |

(52) U.S. Cl.
CPC ...... *H01L 21/6835* (2013.01); *H01L 21/8221* (2013.01); *H01L 21/823412* (2013.01); *H01L 21/823418* (2013.01); *H01L 21/823437* (2013.01); *H01L 21/823475* (2013.01); *H01L 21/823807* (2013.01); *H01L 23/528* (2013.01); *H01L 23/5226* (2013.01); *H01L 29/0673* (2013.01); *H01L 29/0847* (2013.01); *H01L 29/42392* (2013.01); *H01L 29/785* (2013.01); *H01L 29/786* (2013.01); *H01L 21/82385* (2013.01); *H01L 21/823814* (2013.01); *H01L 2221/68363* (2013.01)

(56) References Cited

U.S. PATENT DOCUMENTS

| | | |
|---|---|---|
| 10,157,944 B2 | 12/2018 | Huang et al. |
| 2001/0005018 A1 | 6/2001 | Oh |
| 2002/0024058 A1 | 2/2002 | Marshall |
| 2004/0161865 A1 | 8/2004 | Yu |
| 2005/0133723 A1 | 6/2005 | Lee |
| 2007/0072409 A1 | 3/2007 | Ulmer |
| 2008/0164606 A1 | 7/2008 | Greisen et al. |
| 2009/0014751 A1 | 1/2009 | Kim et al. |
| 2010/0001405 A1 | 1/2010 | Williamson et al. |
| 2010/0038801 A1 | 2/2010 | Gu et al. |
| 2010/0267184 A1 | 10/2010 | Noh |
| 2010/0302424 A1 | 12/2010 | Yamaguchi |
| 2011/0001038 A1 | 1/2011 | Tseng et al. |
| 2011/0089517 A1 | 4/2011 | Venezia |
| 2011/0240997 A1 | 10/2011 | Rockenberger et al. |
| 2012/0068355 A1 | 3/2012 | Aoki et al. |
| 2012/0273907 A1 | 11/2012 | Lim |
| 2012/0305893 A1* | 12/2012 | Colinge ............... B82Y 10/00 257/29 |
| 2012/0326248 A1 | 12/2012 | Daneman et al. |
| 2013/0027073 A1 | 1/2013 | Pagani et al. |
| 2013/0052760 A1 | 2/2013 | Cho |
| 2013/0203248 A1* | 8/2013 | Ernst .................. H01L 21/8221 438/530 |
| 2013/0030846 A1 | 12/2013 | Tang |
| 2014/0177081 A1 | 6/2014 | Sugishima et al. |
| 2014/0253768 A1 | 9/2014 | Li |
| 2014/0353828 A1 | 12/2014 | Edelstein et al. |
| 2015/0028493 A1 | 1/2015 | Nakamura et al. |
| 2015/0279885 A1 | 10/2015 | Tu et al. |
| 2015/0287761 A1 | 10/2015 | Huang et al. |
| 2016/0035722 A1* | 2/2016 | Or-Bach ............... H01L 23/481 257/504 |
| 2016/0181104 A1 | 6/2016 | Schmidt |
| 2016/0181228 A1 | 6/2016 | Higuchi et al. |
| 2016/0197076 A1 | 7/2016 | Kamata |
| 2016/0343532 A1 | 11/2016 | Chuang |
| 2017/0062319 A1 | 3/2017 | Guo et al. |
| 2018/0350853 A1 | 12/2018 | Huang et al. |

OTHER PUBLICATIONS

Cressler, et al. "SiGe HBT Technology: A New Contender for Si-Based RF and Microwave Circuit Applications." IEEE Transactions on Microwave Theory and Techniques, vol. 46, No. 5, May 1998.

Zimmermann, H. "Integrated Silicon Optoelectronics." Chapter 1—Basics of Optical Emission and Absorption. 2010, XX, 386 p. 321 illus., 6 illus. in color., Hardcover. ISBN: 978-3-642-01520-5.

Xu, et al. "Electronic Band Structure and Optical Properties of Silicon Nanoporous Pillar Array." Physica E41(2009) 1882-1885, published Aug. 25, 2009.

Li, et al. "Broadband Infrared Photoluminescence in Silicon Nanowires with High Density Stacking Faults." Nanoscale, 2015, 7, 1601.

Wilamowski, et al. "Fundamentals of Industrial Electronics." Chapter 9—Bipolar Junction Transistor. Published Mar. 4, 2011. ISBN 9781439802793.

Sun, et al. "Delay Time Constant Analysis for Ft Optimization in RF Si/SiGe Bipolar Devices." IEEE article. ISBN 0-7803-7749-4, published in 2003.

Tubert, et al. "High Speed Dual Port Pinned-photodiode for Time-Of-Flight Imaging." 2009 International Image Sensor Workshop, Bergen, Norway, Jun. 22-28, 2009.

Watts, Anthony. A Window on Water Vapor and Planetary Temperature. Published on Jun. 18, 2008. Retrieved from https://wattsupwiththat.com/2008/06/18/a-window-on-water-vapor-and-planetary-temperature/ on May 15, 2017.

Kaufmann, et al. "Near Infrared Image Sensor with Integrated Germanium Photodiodes." Journal of Applied Physics Jul. 2011.

Bob, et al. "Fabrication and Subband Gap Optical Properties of Silicon Supersaturated with Chalcogens by Ion Implantation and Pulsed Laser Melting." Journal of Applied Physics 107, 123506 (2010).

Liu, Jia-Ming. "Photonic Devices." Chapter 14—Lecture 12: Photodiode Detectors. Published online Jan. 2010, ISBN # 9780511614255.

Mayonado, et al. "Investigation of the Bragg-Snell Law in Photonic Crystals." 2015 BFY Proceedings. Edited by Eblen-Zayas, Behringer, and Kozminski; Peer-reviewed, doi:10.1119/bfy.2015.pr.015.

Wang, et al. "Light Trapping in Photonic Crystals." Energy Environ. Sci., 2014, 7, 2725-2738.

Gong, et al. "Photonic Crystals: Principals and Applications." Published Dec. 10, 2013. International Standard Book No. 13: 978-981-4364-83-6 (eBook—PDF).

U.S. Appl. No. 15/449,284, filed Mar. 3, 2017.

U.S. Appl. No. 15/597,452, filed May 17, 2017.

Non-Final Office Action dated Oct. 23, 2017 in connection with U.S. Appl. No. 15/449,284.

Notice of Allowance dated Mar. 30, 2018 in connection with U.S. Appl. No. 15/449,284.

Non-Final Office Action dated Apr. 13, 2018 in connection with U.S. Appl. No. 15/597,452.

Non-Final Office Action dated Apr. 6, 2018 for U.S. Appl. No. 15/609,325.

Notice of Allowance dated Sep. 7, 2018 in connection with U.S. Appl. No. 15/597,452.

Non-Final Office Action dated Oct. 18, 2018 in connection with related U.S. Appl. No. 15/665,495.

Final Office Action dated Mar. 7, 2019 in connection with U.S. Appl. No. 15/665,495.

Notice of Allowance dated Apr. 4, 2019 in connection with U.S. Appl. No. 16/190,608.

Non Final Office Action dated Aug. 13, 2019 for U.S. Appl. No. 16/127,322.

Yokogawa et al. "IR Sensitivity Enhancement of CMOS Image Sensor With Diffractive Light Trapping Pixels." Scientific Reports 7, Article No. 3832 (2017), published on Jun. 19, 2017.

Notice of Allowance dated Nov. 15, 2019 in connection with U.S. Appl. No. 15/633,016.

* cited by examiner

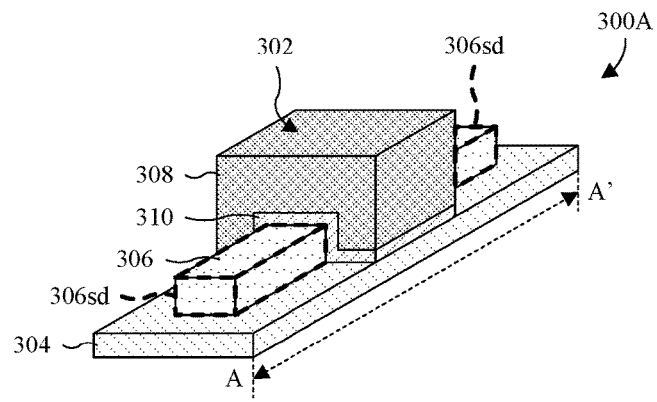
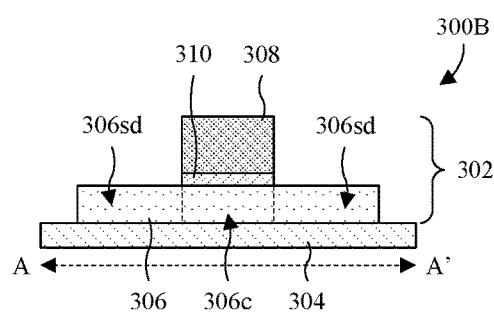
Fig. 3A            Fig. 3B
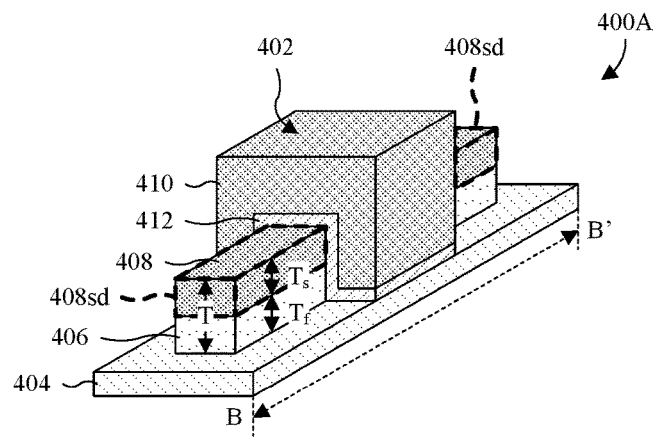
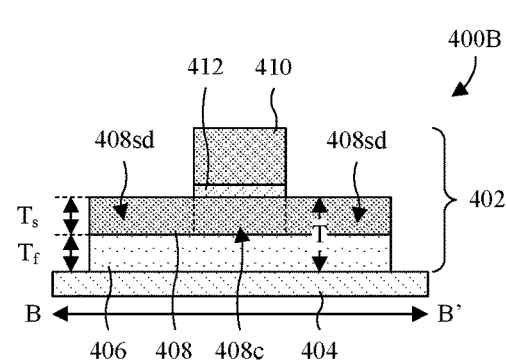
Fig. 4A            Fig. 4B

US 10,964,691 B2

METHOD FOR MANUFACTURING MONOLITHIC THREE-DIMENSIONAL (3D) INTEGRATED CIRCUITS

REFERENCE TO RELATED APPLICATION

This Application is a Divisional of U.S. application Ser. No. 15/633,016, filed on Jun. 26, 2017, the contents of which are hereby incorporated by reference in their entirety.

BACKGROUND

The semiconductor manufacturing industry continually seeks to improve the processing capabilities and power consumption of integrated circuits (ICs). Traditionally, this has been achieved by shrinking the minimum feature size. However, in recent years, process limitations have made it difficult to continue shrinking the minimum feature size. Therefore, the stacking of multiple device layers into three-dimensional (3D) ICs has emerged as a potential approach to continue improving processing capabilities and power consumption of ICs. One type of 3D IC is a monolithic 3D IC in which multiple device layers are formed directly on a single semiconductor substrate (e.g., a wafer).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A and 3B illustrate various views of some embodiments a first doping-type JSD in FIG. 2.

FIGS. 4A and 4B illustrate various views of some embodiments a second doping-type JSD in FIG. 2.

DETAILED DESCRIPTION

Figure 1:
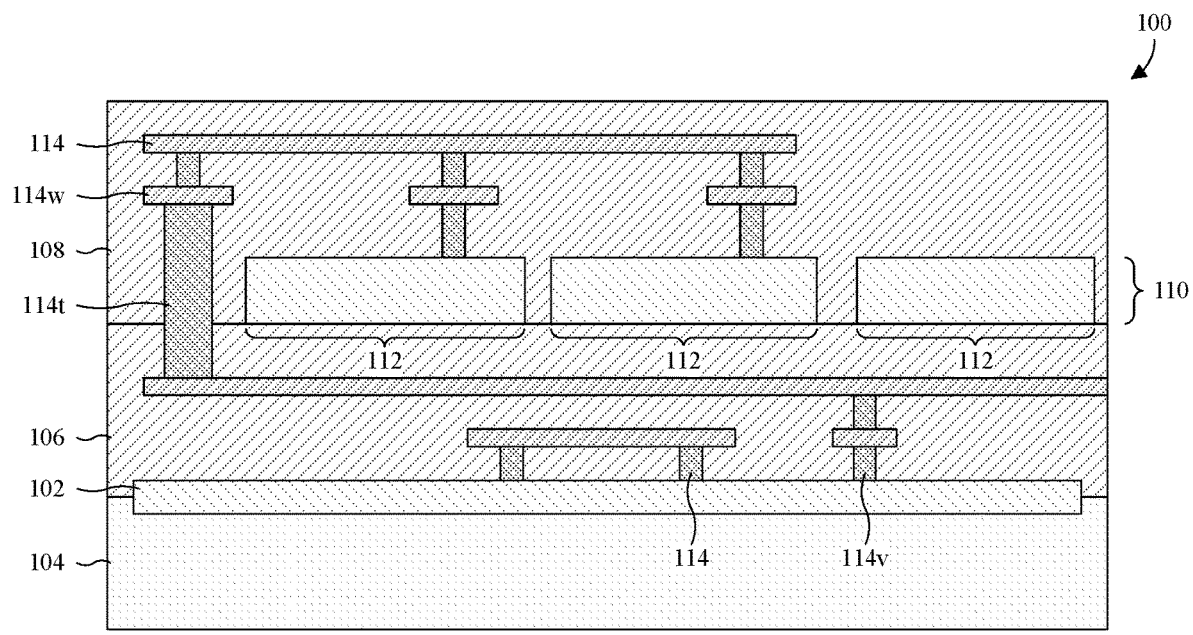
FIG. 1 illustrates a cross-sectional view of some embodiments of a monolithic three-dimensional (3D) integrated circuit (IC) with junctionless semiconductor devices (JSDs).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., conductive wire) may be referred to as a "first" element in some embodiments, the element may be referred to as a "second" element in other embodiments.

A monolithic three-dimensional (3D) integrated circuit (IC) comprises a first device layer in a semiconductor substrate, and a first interlayer dielectric (ILD) layer covering the semiconductor substrate and the first device layer. A second device layer is on the first ILD layer, and a second ILD layer covers the first ILD layer and the second device layer. Interconnect features (e.g., wires, vias, etc.) are stacked within the first and second ILD layers, and electrically couple the first and second device layers together.

An approach to manufacturing the second device layer comprises transferring a semiconductor layer to the ILD layer. The semiconductor layer is then patterned to define device regions, and gate stacks are formed on respective ones of the device regions. With the gate stacks formed, dopants are implanted by ion implantation into the device regions to define source/drain regions. Further, annealing is performed to recrystallize the source/drain regions, since the ion implantation may damage the semiconductor lattice. The annealing is performed at high temperatures in excess of about 600 degrees Celsius (° C.). Further, the annealing may be performed for a short duration (e.g., less than about 100 nanoseconds) at temperatures of about 1100° C. using a short wavelength laser (e.g., wavelengths less than about 800 nanometers). Alternatingly, the annealing may be performed for a long duration (e.g., several minutes or hours) at a temperature of about 630° C. using solid phase epitaxy (SPE).

A challenge with the foregoing approach to manufacturing the second device layer is that it is dependent upon annealing, and the high temperatures of the annealing are prone to damaging underlying layers. For example, the high temperatures may degrade (e.g., increase) metal resistance of at least some of the interconnect features. As another example, the high temperatures may lead to metal contamination of semiconductor layers or structures (e.g., the semiconductor substrate) by diffusion of metal from the interconnect features, since the high temperatures may degrade the effectiveness of diffusion barrier layers lining the interconnect features. As yet another example, the high temperatures may compromise the integrity of silicide layers (e.g., on source/drain regions). Further, reducing the annealing temperature to minimize damage reduces throughput and, hence, increases costs.

In view of the foregoing, various embodiments of the present application are directed towards a method for manufacturing monolithic 3D ICs that reduces the likelihood of damaging layers underlying upper tier device layers. In some embodiments, a first ILD layer is formed over a semiconductor substrate, while also forming first vias and first interconnect wires alternatingly stacked in the first ILD layer. A first doping-type layer and a second doping-type layer are transferred to a top surface of the first ILD layer. The first and second doping-type layers are stacked semiconductor layers with opposite doping types. The first and second doping-type layers are patterned to form a first doping-type wire and a second doping-type wire overlying the first doping-type wire. A gate electrode is formed straddling the first and second doping-type wires. The gate electrode and the first and second doping-type wires at least partially define a junctionless semiconductor device (JSD).

Advantageously, because the JSD is junctionless, ion implantation and annealing are not performed to form source/drain regions after the gate electrode is formed. Therefore, the JSD may be formed without exposing underlying layers (e.g., the first interconnect wires) to high temperatures associated with the annealing. This, in turn, allows the JSD to be formed without damaging the underlying layers. Further, the transferring advantageously allows high temperature processes that would otherwise damage the underlying layers to be performed remote from the underlying layers.

With reference to FIG. 1, a cross-sectional view 100 of some embodiments of a monolithic 3D IC is provided. As illustrated, a first device layer 102 is arranged over and within a semiconductor substrate 104. The first device layer 102 comprises a plurality of semiconductor devices (not individually shown), such as, for example, transistors, memory cells, pixel sensors, some other type of semiconductor devices, or a combination of the foregoing. A first ILD layer 106 covers the semiconductor substrate 104 and the first device layer 102, and a second ILD layer 108 covers the first ILD layer 106.

A second device layer 110 is arranged on the first ILD layer 106, between the first ILD layer 106 and the second ILD layer 108. The second device layer 110 comprises a plurality of JSDs 112, such as, for example, junctionless nanowire transistors. The JSDs 112 are semiconductor devices devoid of semiconductor junctions and doping concentration gradients. Semiconductor junctions include, for example, junctions between different semiconductor materials (e.g., heterojunctions), metal-semiconductor junctions (e.g., Schottky junctions), and junctions between different semiconductor doping types and/or doping concentrations (e.g., PN junctions, N+N junctions, P+P junctions).

Interconnect features 114 are stacked within the first and second ILD layers 106, 108, and electrically couple the first and second device layers 102, 110 together. For ease of illustration, only some of the interconnect features 114 are labeled 114. The interconnect features 114 comprise vias 114v and interconnect wires 114w, and the vias 114v comprise a through device-layer via (TDV) 114t (among other types of vias not specifically enumerated). The TDV 114t extends through the second device layer 110, from over the second device layer 110 to below the second device layer 110, to facilitate electrical coupling of the second device layer 110 to the first device layer 102. For ease of illustration, only one of the vias 114v is labeled 114v, and only one of the interconnect wires 114w is labeled 114w. The vias 114v and the interconnect wires 114w are conductive, such as, for example, aluminum copper, copper, tungsten, some other metal, or a combination of the foregoing.

Advantageously, because the JSDs 112 are junctionless, ion implantation and annealing are not performed to specifically form source/drain regions. Therefore, the second device layer 110 may be formed without exposing underlying layers (e.g., the interconnect wires 114w) to high temperatures associated with the annealing. This, in turn, allows the second device layer 110 to be formed without damaging the underlying layers. In some embodiments, the JSDs 112 are formed at temperatures less than about 500° C. or less than about 600° C. Further, in some embodiments, the JSDs 112 are formed at temperatures between about 350-500° C. and/or between about 400-450° C.

Figure 2:
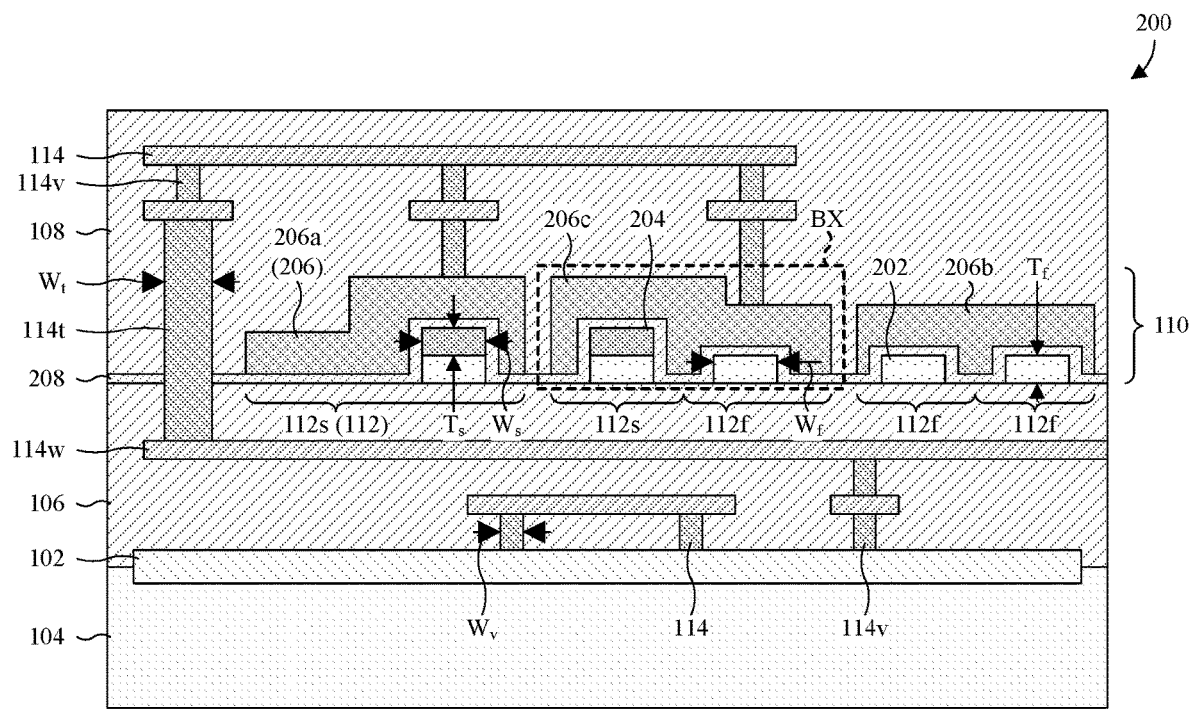
FIG. 2 illustrates a cross-sectional view of some more detailed embodiments of the monolithic 3D IC of FIG. 1.

With reference to FIG. 2, a cross-sectional view 200 of some more detailed embodiments of the monolithic 3D IC of FIG. 1 is provided. As illustrated, a first device layer 102 is arranged over and within a semiconductor substrate 104. The first device layer 102 comprises a plurality of semiconductor devices (not individually shown). The semiconductor substrate 104 may be, for example, a bulk substrate of silicon (e.g., monocrystalline silicon) or some other type of semiconductor substrate.

A first ILD layer 106 covers the semiconductor substrate 104 and the first device layer 102, and a second ILD layer 108 covers the first ILD layer 106. The first and second ILD layers 106, 108 may be, for example, silicon dioxide, a low κ dielectric, some other dielectric, or a combination of the foregoing. As used herein, a low κ dielectric is a dielectric with a dielectric constant κ less than about 3.9, 3.0, 2.0, or 1.0.

A second device layer 110 is arranged on the first ILD layer 106, between the first ILD layer 106 and the second ILD layer 108. The second device layer 110 comprises a plurality of JSDs 112. For ease of illustration, only one of the JSDs 112 is labeled 112. The JSDs 112 are semiconductor devices lacking semiconductor junctions and doping concentration gradients. The semiconductor junctions include, for example, heterojunctions, Schottky junctions, and PN junctions. The JSDs 112 comprise first doping-type JSDs 112f having selectively-conductive channels with a first doping type, and/or comprise second doping-type JSDs 112s having selectively-conductive channels with a second doping type opposite the first doping type. For example, the first doping-type JSDs 112f may be n type and the second doping-type JSDs 112s may be p type, or vice versa.

The JSDs 112 each comprise a first doping-type wire 202. For ease of illustration, only one of the first doping-type wires 202 is labeled 202. The first doping-type wires 202 are semiconductor wires with the first doping type and define the selectively-conductive channels for the first doping-type JSDs 112f. Further, the first doping-type wires 202 have a single doping type and a substantially uniform doping concentration throughout. The first doping-type wires 202 may be, for example, monocrystalline silicon or some other type of semiconductor, and/or may be, for example, laterally elongated in a direction substantially orthogonal to the cross-sectional view 200 (e.g., into and out of the page).

The second doping-type JSDs 112s, but not the first doping-type JSDs 112f, further each comprise a second doping-type wire 204. For ease of illustration, only one of the second doping-type wires 204 is labeled 204. The second doping-type wires 204 are semiconductor wires with the second doping type and define the selectively-conductive channels for the second doping-type JSDs 112s. Further, the second doping-type wires 204 at least partially cover respective ones of the first doping-type wires 204, and have a single doping type and a substantially uniform doping concentration throughout. In some embodiments, the second doping-type wires 204 are monocrystalline silicon or some other type of semiconductor material, and/or are the same semiconductor material as the first doping-type wires 202. Further, in some embodiments, the second doping-type wires 204 are laterally elongated in a direction orthogonal to the cross-sectional view 200 (e.g., into and out of the page), and/or have the same or different layouts as the respective ones of the first doping-type wires 202.

The first doping-type wires 202 each have a first width $W_f$, and the second doping-type wires 204 each have a second width $W_s$. In some embodiments, the first width $W_f$ and/or the second width $W_s$ is/are each between about 1-50 nanometers (nm), about 1-40 nm, about 4-20 nm, or about 6-14 nm. For example, the first width $W_f$ and/or the second width $W_s$ is/are each about 10 nm. Further, in some embodiments, the first width $W_f$ is substantially uniform across the first doping-type wires 202, and/or the second width $W_s$ is substantially uniform across the second doping-type wires 204. Alternatively, in some embodiments, the first width $W_f$ varies across the first doping-type wires 202, and/or the second width $W_s$ varies across the second doping-type wires 204. Further yet, in some embodiments, the first width $W_f$ is substantially the same as the second width $W_s$. Alternatively, in other embodiments, the first width $W_f$ is different than the second width $W_s$.

The first doping-type wires 202 each have a first thickness $T_f$, and the second doping-type wires 204 each have a second thickness $T_s$. In some embodiments, the first thickness $T_f$ and/or the second thickness $T_s$ is/are each be between about 1-100 nm, about 3-50 nm, about 10-30 nm, or about 1-20 nm. For example, the first thickness $T_f$ and/or the second thickness $T_s$ is/are each about 10 nm. Further, in some embodiments, the first thickness $T_f$ is substantially uniform across the first doping-type wires 202, and/or the second thickness $T_s$ is substantially uniform across the second doping-type wires 204. Further yet, in some embodiments, the first thickness $T_f$ is substantially the same as the second thickness $T_s$. Alternatively, in other embodiments, the first thickness $T_f$ is different than the second thickness $T_s$.

The JSDs 112 further comprise respective gate electrodes 206 straddling the first and second doping-type wires 202, 204, laterally offset from ends of the first and second doping-type wires 202, 204. For ease of illustration, only one of the gate electrodes 206 is labeled 206. In some embodiments, the gate electrodes 206 comprise a gate electrode 206a individual to one of the JSDs 112. Further, in some embodiments, the gate electrodes 206 comprise a gate electrode 206b shared by a plurality of the JSDs 112 that are the same doping type. Further yet, in some embodiments, the gate electrodes 206 comprise a gate electrode 206c shared by a plurality of the JSDs 112 that are different doping types. The gate electrodes 206, may be, for example, metal, doped polysilicon, some other conductor, or a combination of the foregoing.

A gate dielectric layer 208 spaces and electrically insulates the gate electrodes 206 from the first and second doping-type wires 202, 204. The gate dielectric layer 208 may be, for example, silicon dioxide, a high κ dielectric, some other dielectric, or a combination of the foregoing. As used herein, a high κ dielectric is a dielectric with a dielectric constant κ greater than about 3.9, 5.0, 10.0, or 20.0.

In some embodiments, the JSDs 112 are normally ON semiconductor devices that operate in depletion mode. That is to say, in the absence of external electric fields, the selectively-conductive channels of the JSDs 112 are conductive. In response to applying an external electric field to a selectively-conductive channel of a JSD by a respective gate electrode, free or mobile charge carrier (e.g., electrons or holes) are depleted from proximate the respective gate electrode, such that the selectively-conductive channel becomes insulating (i.e., OFF). In effect, the depletion pinches off the flow of current through the selectively-conductive channel.

Interconnect features 114 are stacked within the first and second ILD layers 106, 108. Further, in some embodiments, the interconnect features 114 electrically couple the first and second device layers 102, 110 together. For ease of illustration, only some of the interconnect features 114 are labeled 114. The interconnect features 114 comprise vias 114v and interconnect wires 114w, and the vias 114v comprise a TDV 114t. For ease of illustration, only some of the vias 114v is labeled 114v, and only one of the interconnect wires 114w is labeled 114w. The vias 114v extend vertically to electrically couple neighboring interconnect wires together, and to electrically couple the interconnect wires 114w to the first and second device layers 102, 110. The TDV 114t (a special type of via) further extends through the second device layer 110, from over the second device layer 110 to below the second device layer 110, to facilitate electrical coupling between the first and second device layers 102, 110. The TDV 114t may, for example, have a width $W_t$ greater than a width $W_v$ of other ones of the vias 114v. The interconnect wires 114w extend laterally to electrically neighboring vias together.

With reference to FIGS. 3A and 3B, various views 300A, 300B of some embodiments of a first doping-type JSD 302 is provided. FIG. 3A provides a perspective view 300A of the first doping-type JSD 302, and FIG. 3B provides a cross-sectional view 300B of the first doping-type JSD 302 along line A-A' in FIG. 3A. The first doping-type JSD 302 may, for example, be representative of some or all of the first doping-type JSDs 112f of FIG. 2.

As illustrated, the first doping-type JSD 302 is arranged on a dielectric layer 304, and comprises a doped wire 306. The doped wire 306 is a semiconductor material with a single doping type, and is conductive from end to end in the absence of an external electric field. The single doping type may be, for example, n type or p type. Further, the doped wire 306 has a substantially uniform doping concentration throughout and is devoid of semiconductor junctions (e.g., heterojunctions, Schottky junctions, or PN junctions). The doped wire 306 may be, for example, monocrystalline silicon or some other type of semiconductor.

A gate electrode 308 straddles the doped wire 306 and is spaced from the doped wire 306 by a gate dielectric layer 310. Further, the gate electrode 308 is spaced from ends of the doped wire 306, along the length of the doped wire 306, and divides the doped wire 306 into a selectively-conductive channel 306c (not visible in FIG. 3A) and a pair of source/drain regions 306sd. The selectively-conductive channel 306c is directly under the gate electrode 308, between the source/drain regions 306sd. Further, the selectively-conductive channel 306c is conductive in the absence of an electric field, and may be, for example, insulating in response to an electric field generated by applying a voltage to the gate electrode 308. The gate electrode 308 may be, for example, doped polysilicon, metal, or some other conductive material.

With reference to FIGS. 4A and 4B, various views 400A, 400B of some embodiments of a second doping-type JSD 402 is provided. FIG. 4A provides a perspective view 400A of the second doping-type JSD 402, and FIG. 4B provides a cross-sectional view 400B of the second doping-type JSD 402 along line B-B' in FIG. 4A. The second doping-type JSD 402 may, for example, be representative of some or all of the second doping-type JSDs 112s of FIG. 2.

As illustrated, the second doping-type JSD 402 is arranged on a dielectric layer 404, and comprises a first doping-type wire 406. The first doping-type wire 406 is a semiconductor material with a single doping type. Further, the first doping-type wire 406 has a substantially uniform doping concentration throughout and is devoid of semiconductor junctions. In some embodiments, the first doping-type wire 406 is conductive from end to end in the absence of an external electric field. The first doping-type wire 406 may be, for example, monocrystalline silicon or some other type of semiconductor.

A second doping-type wire 408 overlies the first doping-type wire 406. In some embodiments, the second doping-type wire 408 has the same layout as the first doping-type wire 406, and/or completely covers the first doping-type wire 406. In other embodiments, the second doping-type wire 408 has a different layout than the first doping-type wire 406, and/or partially covers the first doping-type wire 406. Further, the second doping-type wire 408 is a semiconductor material with a single doping type that is opposite that of first doping-type wire 406. For example, the first doping-type wire 406 may be p type and the second doping-type wire 408 may be n type, or vice versa. Further yet, the second doping-type wire 408 has a substantially uniform doping concentration throughout and is devoid of semiconductor junctions (e.g., heterojunctions, Schottky junctions, or PN junctions). The second doping-type wire 408 may be, for example, monocrystalline silicon or some other type of semiconductor.

In some embodiments, the first doping-type wire 406 has a first thickness $T_f$ that is substantially the same as a second thickness $T_s$ of the second doping-type wire 408. Alternatively, in other embodiments, the first thickness $T_f$ is different than the second thickness $T_s$. Further, in some embodiments, the first and second doping-type wires 406, 408 have a combined thickness T (i.e., $T_f+T_s$) between about 1-150 nm, about 5-100 nm, about 10-50 nm, or about 10-30 nm. For example, the combined thickness T may be about 20 nm.

A gate electrode 410 straddles the first and second doping-type wires 406, 408, and is spaced from the first and second doping-type wires 406, 408 by a gate dielectric layer 412. Further, the gate electrode 410 is spaced from ends of the second doping-type wire 408, along the length of the second doping-type wire 408, and divides the second doping-type wire 408 into a selectively-conductive channel 408c (not visible in FIG. 4A) and a pair of source/drain regions 408sd. The selectively-conductive channel 408c is directly under the gate electrode 410, between the source/drain regions 408sd. Further, the selectively-conductive channel 408c is conductive in the absence of an electric field, and may be, for example, insulating in response to an electric field generated by applying a voltage to the gate electrode 410. The gate electrode 410 may be, for example, doped polysilicon, metal, or some other conductive material.

With reference to FIGS. 5A-5D, perspective views 500A-500D of various embodiments of a pair of JSDs 502a, 502b with opposite doping types are provided. The JSDs 502a, 502b may, for example, correspond to the JSDs 112 in box BX of FIG. 2.

Figure 5A:
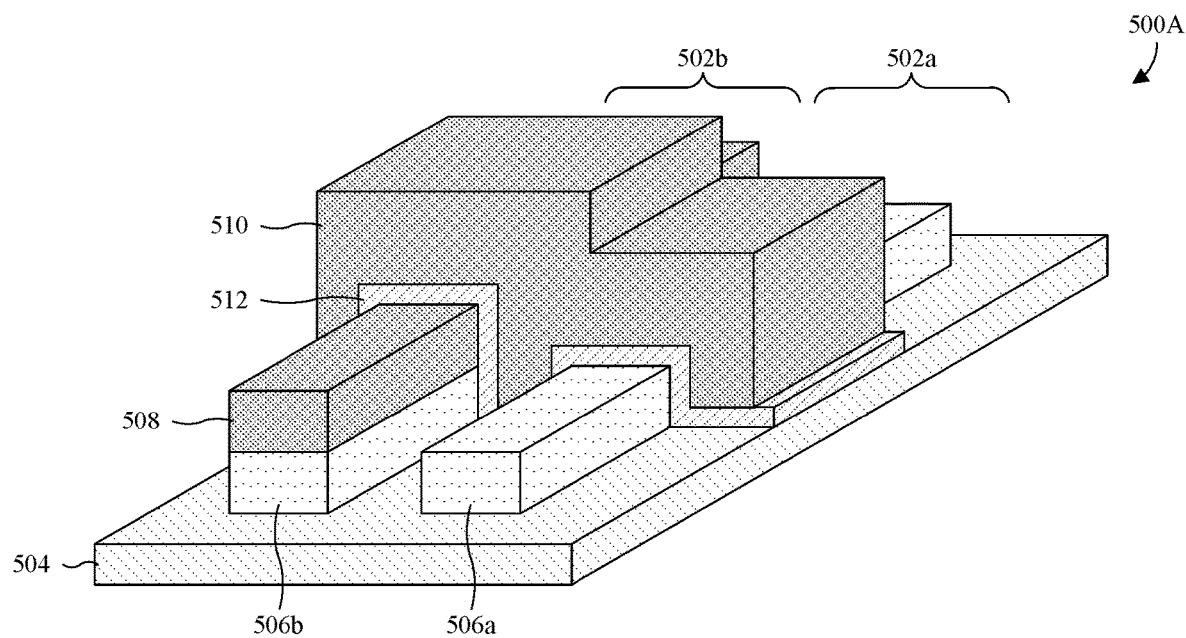
FIGS. 5A-5D illustrate perspective views of various embodiments of a pair of JSDs in FIG. 2.

As illustrated by the perspective view 500A of FIG. 5A, the JSDs 502a, 502b are arranged on a dielectric layer 504, and comprise a first doping-type JSD 502a and a second doping-type JSD 502b. The first and second doping-type JSDs 502a, 502b each comprise a first doping-type wire 506a, 506b. The first doping-type wires 506a, 506b are devoid of semiconductor junctions, and have a single doping type and a uniform doping concentration. Further, the second doping-type JSD 502b, but not the first doping-type JSD 502a, comprises a second doping-type wire 508. The second doping-type wire 508 is also devoid of semiconductor junctions, and has a single doping type opposite that of the first doping-type wires 506a, 506b. Further, the second doping-type wire 508 has a uniform doping concentration, and covers a first doping-type wire 506b of the second doping-type JSD 502b.

A gate electrode 510 straddles the first and second doping-type wires 506a, 506b, 508, and is laterally spaced from ends of the first and second doping-type wires 506a, 506b, 508. Further, the gate electrode 510 is spaced from the first and second doping-type wires 506a, 506b, 508 by a gate dielectric layer 512. In alternative embodiments, the JSDs 502a, 502b may have individual gate electrodes.

Figure 5B:
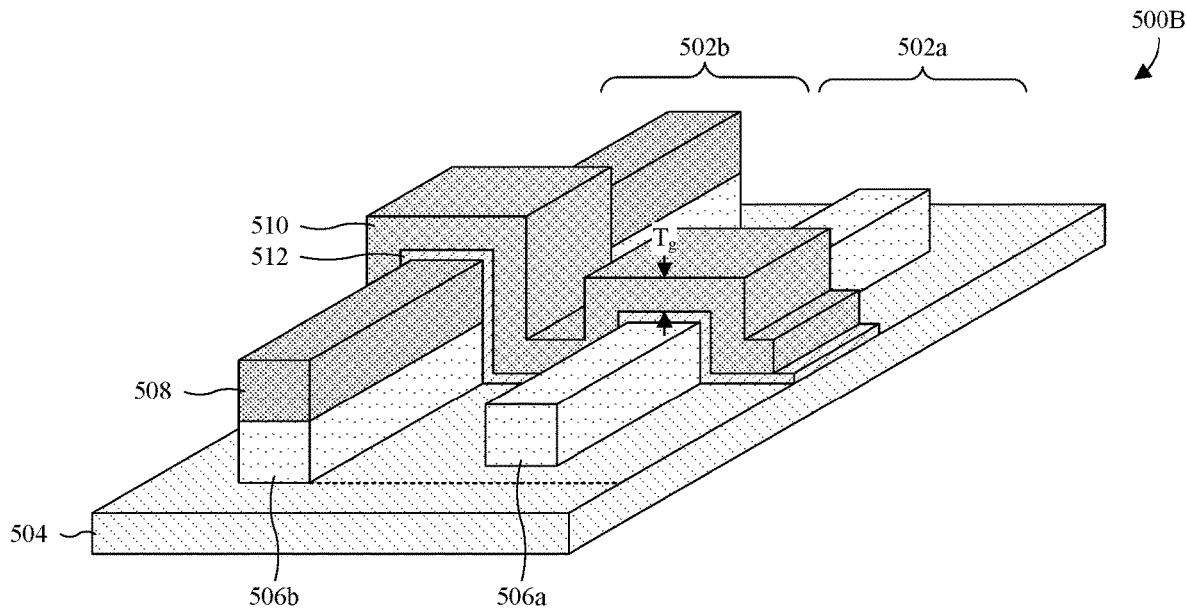

As illustrated by the perspective view 500B of FIG. 5B, a variant of FIG. 5A is provided in which the gate electrode 510 has a U-shaped profile between the first doping-type wires 506a, 506b. Further, in some embodiments, the gate electrode 510 has a substantially uniform thickness $T_g$ along its length, and/or conforms to the first doping-type wires 506a, 506b and the second doping-type wire 508.

Also illustrated by the perspective view 500B of FIG. 5B, the first doping-type wire 506a of the first doping-type JSD 502a has a different layout and/or footprint than the first doping-type wire 506b of the second doping-type JSD 502b. In particular, the first doping-type wires 506a, 506b are illustrated with different lengths. As used herein, a footprint is a two-dimensional (2D) projection of a structure onto an underlying horizontal plane (e.g., a top surface of the dielectric layer 504). Other variations between the footprints and/or layouts are amenable in other embodiments. For example, the footprints and/or layouts may have different shapes, lengths, widths, or a combination of the forgoing.

Figure 5C:
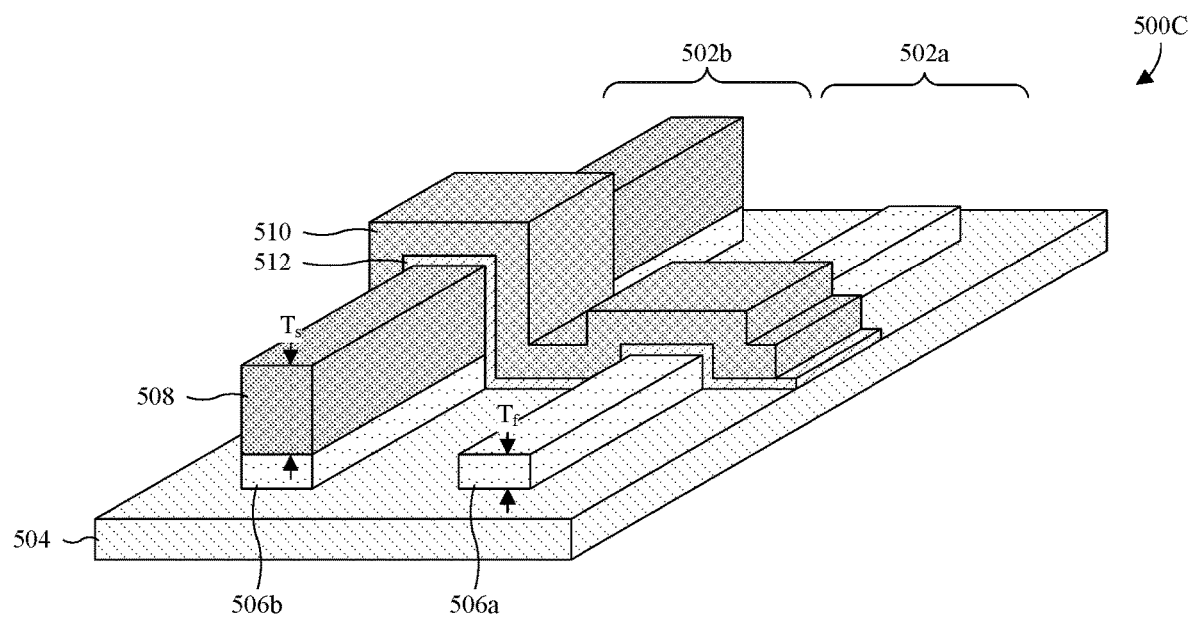

As illustrated by the perspective view 500C of FIG. 5C, a variant of FIG. 5B is provided in which the first doping-type wires 506a, 506b share a first thickness $T_f$ that is less than a second thickness $T_s$ of the second doping-type wire 508. In alternative embodiments, the first thickness $T_f$ is greater than the second thickness $T_s$.

Figure 5D:
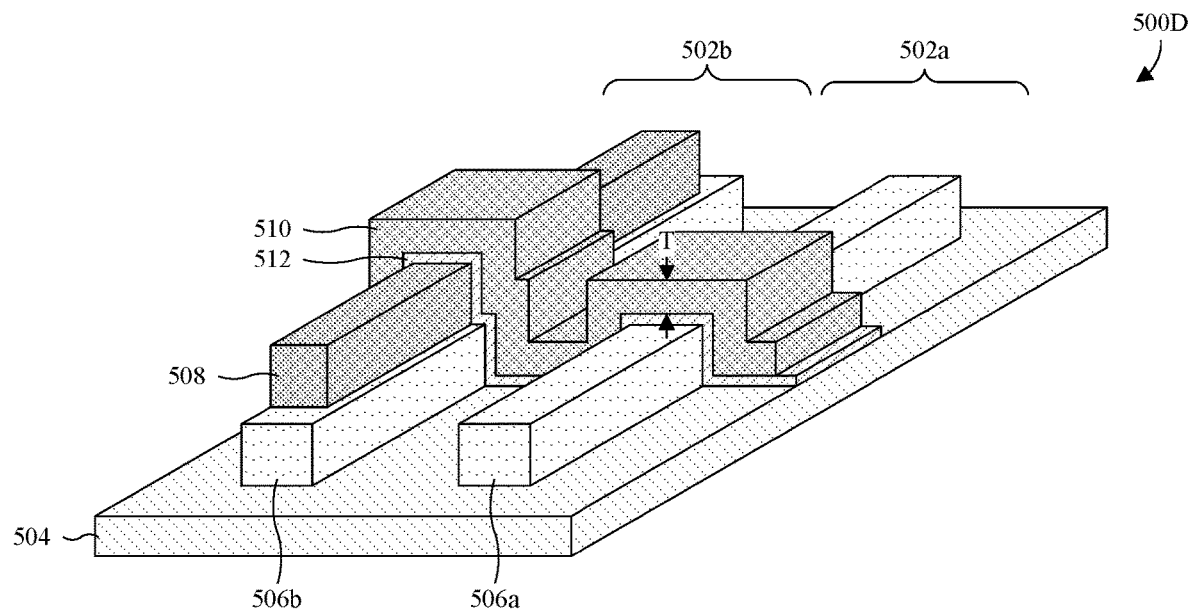

As illustrated by the perspective view 500D of FIG. 5D, a variant of FIG. 5B is provided in which the second doping-type wire 508 has a different layout and/or footprint than the first doping-type wire 506b of the second JSD 502b. In particular, the second doping-type wire 508 is illustrated with a smaller width and a smaller length compared to the first doping-type wire 506b of the second JSD 502b. Other variations between the footprints and/or layouts are amenable in other embodiments. For example, the footprints and/or layouts may have different shapes, lengths, widths, or a combination of the forgoing.

Figure 6A:
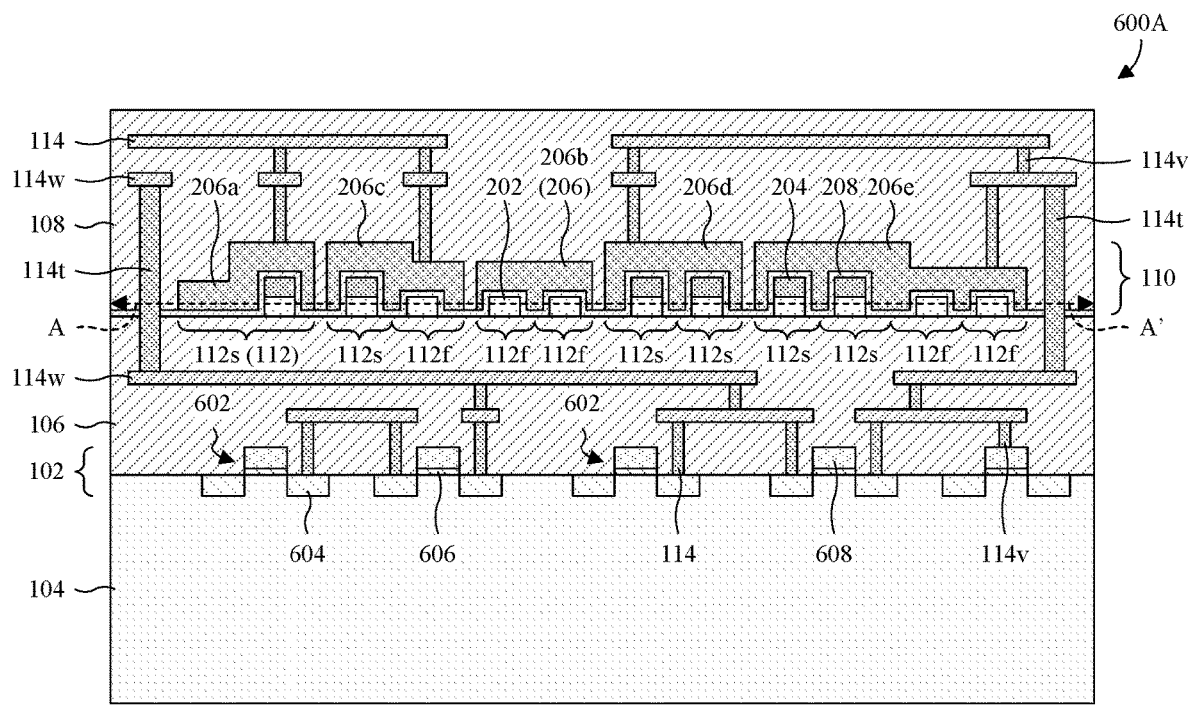
FIGS. 6A and 6B illustrate various views of some more detailed embodiments of the monolithic 3D IC of FIG. 2.
Figure 6B:
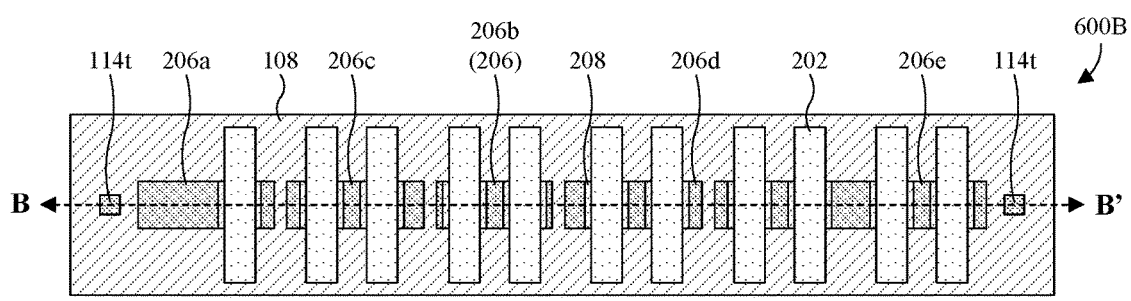

With reference to FIGS. 6A and 6B, various views 600A, 600B of some more detailed embodiments of the monolithic 3D IC of FIG. 2 are provided. FIG. 6A provides a cross-sectional view 600A of the monolithic 3D IC along line B-B' in FIG. 6B, and FIG. 6B provides a layout view of the monolithic 3D IC along line A-A' in FIG. 6A.

As illustrated by the cross-sectional view 600A of FIG. 6A, a first device layer 102 is arranged over and within a semiconductor substrate 104, and comprises a plurality of semiconductor devices 602. For ease of illustration, only some of the semiconductor devices 602 are labeled 602. In some embodiments, some or all of the semiconductor devices 602 each comprise a pair of source/drain regions 604, a gate dielectric layer 606, and a gate electrode 608. The gate electrode 608 is between the source/drain regions 604, and is spaced over the semiconductor substrate 104 by the gate dielectric layer 606. For ease of illustration, only one of the source/drain regions 604 is labeled 604, only one of the gate dielectric layers 606 is labeled 606, and only one of the gate electrodes 608 is labeled 608. Further, in some embodiments, the semiconductor devices 602 have semiconductor junctions (e.g., PN junctions) and/or doping concentration gradients. Further yet, in some embodiments, the semiconductor devices 602 comprise n-type field-effect transistors (FETs) and/or p-type FETs.

A first ILD layer 106 covers the semiconductor substrate 104 and the first device layer 102, and a second ILD layer 108 covers the first ILD layer 106. Further, a second device layer 110 is arranged on the first ILD layer 106, between the first ILD layer 106 and the second ILD layer 108. The second device layer 110 comprises a plurality of JSDs 112. For ease of illustration, only one of the JSDs 112 is labeled 112. In some embodiments, some or all of the JSDs 112 are each directly over and/or aligned along a vertical axis to a respective one of the semiconductor devices 602. The JSDs 112 comprise first doping-type JSDs 112f, and/or comprise second doping-type JSDs 112s.

The JSDs 112 each comprise a first doping-type wire 202. For ease of illustration, only one of the first doping-type wires 202 is labeled 202. The first doping-type wires 202 are semiconductor wires with a first doping type and define selectively conductive channels for the first doping-type JSDs 112f. Further, the second doping-type JSDs 112s, but not the first doping-type JSDs 112f, each comprise a second doping-type wire 204. For ease of illustration, only one of the second doping-type wires 204 is labeled 204. The second doping-type wires 204 are semiconductor wires with a second doping type opposite the first doping type, and define selectively conductive channels for the second doping-type JSDs 112s. Further, the second doping-type wires 204 overlie respective ones of the first doping-type wires 202.

The JSDs 112 further comprise respective gate electrodes 206 straddling the first and second doping-type wires 202, 204. For ease of illustration, only one of the gate electrodes 206 is labeled 206. In some embodiments, the gate electrodes 206 comprise a gate electrode 206a individual to one of the JSDs 112. Further, in some embodiments, the gate electrodes 206 comprise a gate electrode (e.g., 206b or 206d) shared by a plurality of the JSDs 112 that are the same doping type. Further yet, in some embodiments, the gate electrodes 206 comprise a gate electrode (e.g., 206c or 206e) shared by a plurality of the JSDs 112 that are different doping types. The gate electrodes 206 are spaced and electrically insulated from the first and second doping-type wires 202, 204 by a gate dielectric layer 208.

Interconnect features 114 are stacked within the first and second ILD layers 106, 108, and electrically couple the first and second device layers 102, 110 together. For ease of illustration, only some of the interconnect features 114 are labeled 114. The interconnect features 114 comprise vias 114v and interconnect wires 114w. For ease of illustration, only some of the vias 114v are labeled 114v, and only some of the interconnect wires 114w are labeled 114w. Further, the vias 114v comprise TDVs 114t extending through the second device layer 110, from over the second device layer 110 to below the second device layer 110, to facilitate electrical coupling of the second device layer 110 to the first device layer 102.

As illustrated by the layout view 600B of FIG. 6B, the first doping-type wires 202 are laterally elongated. For example, the first doping-type wires 202 may be laterally elongated in a direction substantially orthogonal to line B-B'. Further, the gate electrodes 206 straddle the first doping-type wires 202 and are laterally spaced from ends of the first doping-type wires 202. In some embodiments, the gate electrodes 206 are at midpoints along lengths of the first doping-type wires 202. Further, in some embodiments, the second doping-type wires 204 (see FIG. 6A) have the same layouts and/or footprints as respective ones of the first doping-type wires 202, and/or entirely cover the first doping-type wires 202. Further yet, in some embodiments, layouts and/or footprints of the first doping-type wires 202 vary amongst the first doping-type wires 202. For example, one of the first doping-type wires 202 may have an oval shaped layout and/or footprint, whereas another one of the first doping-type wires 202 may have a square or rectangular shaped layout and/or footprint.

Figure 7:
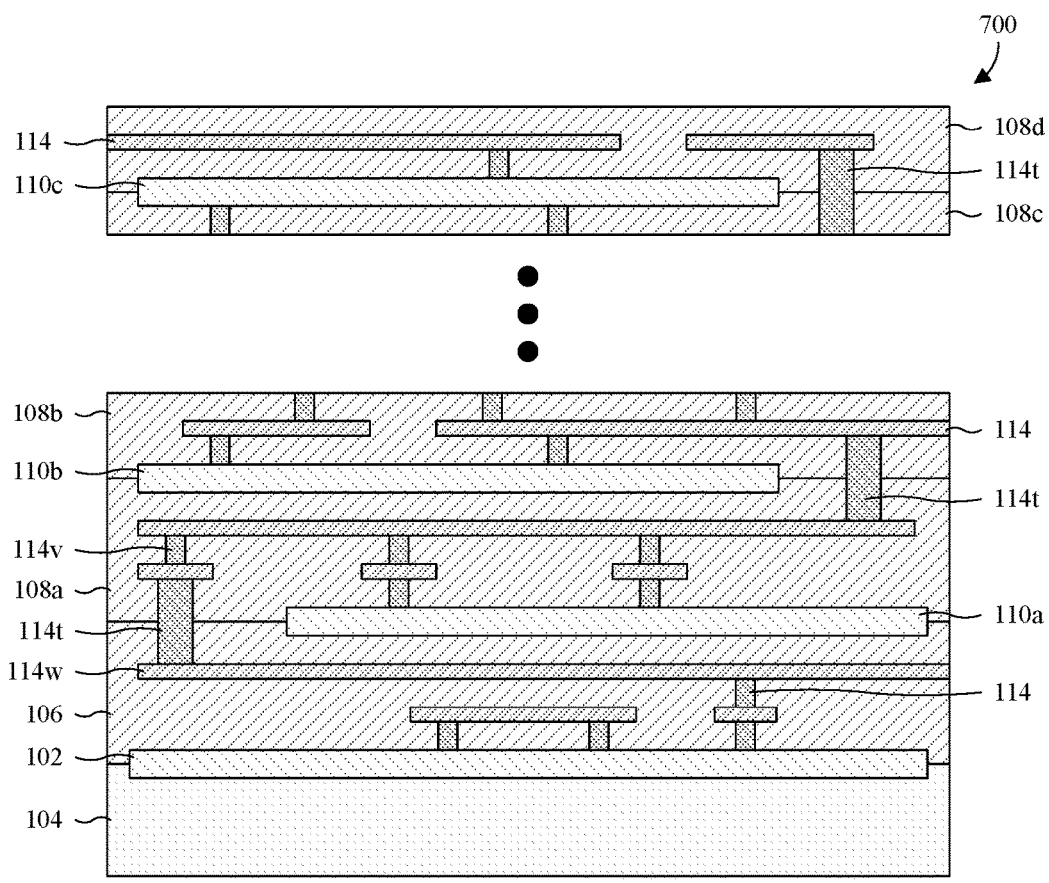
FIG. 7 illustrates a cross-sectional view of some other embodiments of the monolithic 3D IC of FIG. 1.

With reference to FIG. 7, a cross-sectional view 700 of some other embodiments of the monolithic 3D IC of FIG. 1 is provided. As illustrated, a first device layer 102 is arranged over and in a semiconductor substrate 104, and is covered by a first ILD layer 106. The first device layer 102 may, for example, be made up of semiconductor devices with semiconductor junctions. Further, a plurality of second ILD layers 108a-108d are stacked over the first ILD layer 106, and a plurality of second device layers 110a-110c are stacked within the first and second ILD layers 106, 108a-108d. The second ILD layers 108a-108d may, for example, be configured as the second ILD layer 108 in FIG. 1, 2, or 6A.

The second device layers 110a-110c are electrically coupled together and to the first device layer 102 by interconnect features 114 in the first and second ILD layers 106, 108a-108d. For ease of illustration, only some of the interconnect features 114 are labeled 114. The interconnect features 114 comprise vias 114v and interconnect wires 114w alternatively stacked in the first and second ILD layers 106, 108a-108d. For ease of illustration, only one of the vias 114v is labeled 114v, and only one of the interconnect wires 114w is labeled 114w. The vias 114v comprise TDVs 114t extending through the second device layers 110a-110c. The second device layers 110a-110c may, for example, be made up of JSDs, and/or may, for example, be configured as the second device layer 110 of FIG. 1, 2, or 6A.

With reference to FIGS. 8-10, 11A, 11B, 12A, 12B, and 13-15, a series of cross-sectional views 800-1000, 1100A, 1100B, 1200A, 1200B, and 1300-1500 illustrate some embodiments of a method for manufacturing a monolithic 3D IC. The monolithic 3D IC may, for example, correspond to FIGS. 6A and 6B.

Figure 8:
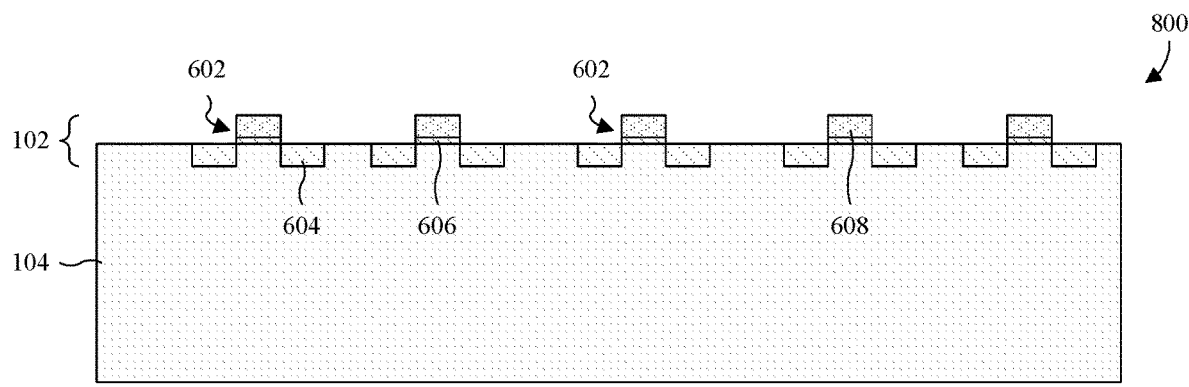
FIGS. 8-10, 11A, 11B, 12A, 12B, and 13-15 illustrate a series of cross-sectional views of some embodiments of a method for manufacturing a monolithic 3D IC.

As illustrated by the cross-sectional view 800 of FIG. 8, a first device layer 102 is formed over and in a semiconductor substrate 104, and comprises a plurality of semiconductor devices 602. For ease of illustration, only some of the semiconductor devices 602 are labeled 602. In some embodiments, all or some of the semiconductor devices 602 each comprise a pair of source/drain regions 604, a gate dielectric layer 606, and a gate electrode 608. The gate electrode 608 is between the source/drain regions 604, and is spaced over the semiconductor substrate 104 by the gate dielectric layer 606. For ease of illustration, only one of the source/drain regions 604 is labeled 604, only one of gate dielectric layers 606 is labeled 606, and only one of the gate electrodes 608 is labeled 608.

In some embodiments, a process for forming the first device layer 102 comprises forming a dielectric layer covering the semiconductor substrate 104, and subsequently forming a conductive layer covering the dielectric layer. Further, in some embodiments, the process comprises selectively etching the dielectric layer and the conductive layer to form the gate electrodes 608 and the gate dielectric layers 606 stacked over the semiconductor substrate 104. Further yet, in some embodiments, the process comprises selectively performing ion implantation into the semiconductor substrate 104, with the gate electrodes 608 and the gate dielectric layers 606 in place, to define the source/drain regions 604, and subsequently annealing the semiconductor substrate 104 to repair damage to the crystalline lattice of the semiconductor substrate 104 by the ion implantation. In some embodiments, the annealing is performed at high temperatures greater than, for example, about 600, 800, 1000, or 1200° C., and/or at high temperatures between, for example, about 600-1200° C., about 800-1000° C., about 750-1200° C., or about 700-1100° C.

Figure 9:
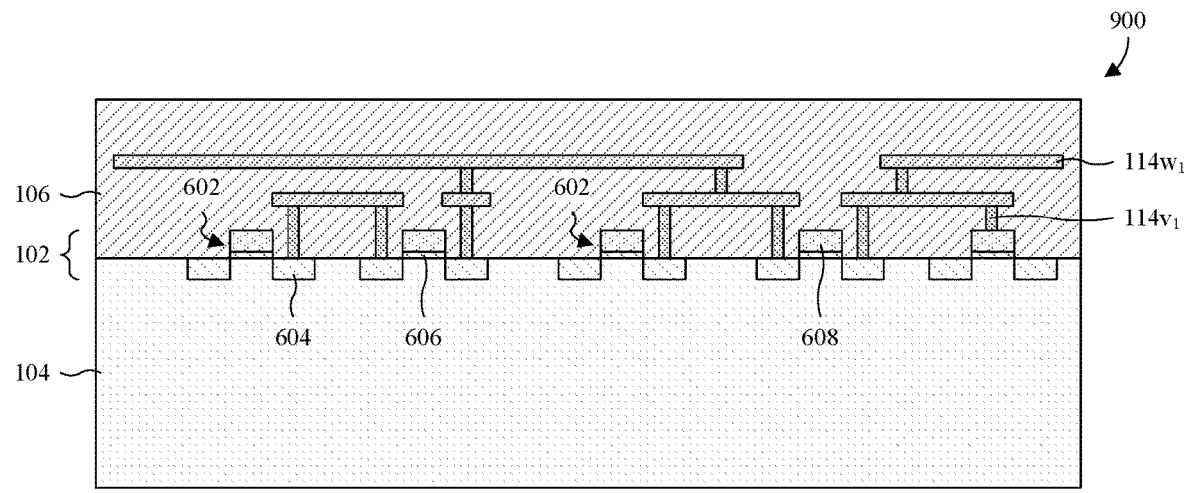

As illustrated by the cross-sectional view 900 of FIG. 9, a first ILD layer 106 is formed covering the first device layer 102, while first interconnect wires 114$w_1$ and first vias 114$v_1$ are formed alternatingly stacked in the first ILD layer 106. For ease of illustration, only one of the first interconnect wires 114$w_1$ is labeled 114$w_1$, and only one of the first vias 114$v_1$ is labeled 114$v_1$. The first interconnect wires 114$w_1$ and first vias 114$v_1$ are further formed electrically coupled to the first device layer 102. In some embodiments, the first interconnect wires 114$w_1$ and the first vias 114$v_1$ are formed of aluminum copper, aluminum, copper, tungsten, some other conductive material, or a combination of the foregoing. In some embodiments, the first ILD layer 106 is formed of a transparent material to facilitate alignment between patterns of selective etches performed hereafter and features (e.g., the first interconnect wires 114$w_1$ or the first vias 114$v_1$) within the first ILD layer 106.

In some embodiments, a process for forming the first ILD layer 106, the first interconnect wires 114$w_1$, and the first vias 114$v_1$ comprises repeatedly forming an ILD sublayer (i.e., a sublayer of the first ILD layer 106) over the semiconductor substrate 104, performing a planarization into an upper or top surface of the ILD sublayer, selectively etching the ILD sublayer to form a via opening and/or an interconnect wiring opening, and filling the via opening and/or the interconnect wiring opening with a conductive material. The planarization may, for example, be performed by a chemical mechanical polish (CMP), and the etching may, for example, be performed using photolithography.

Figure 10:
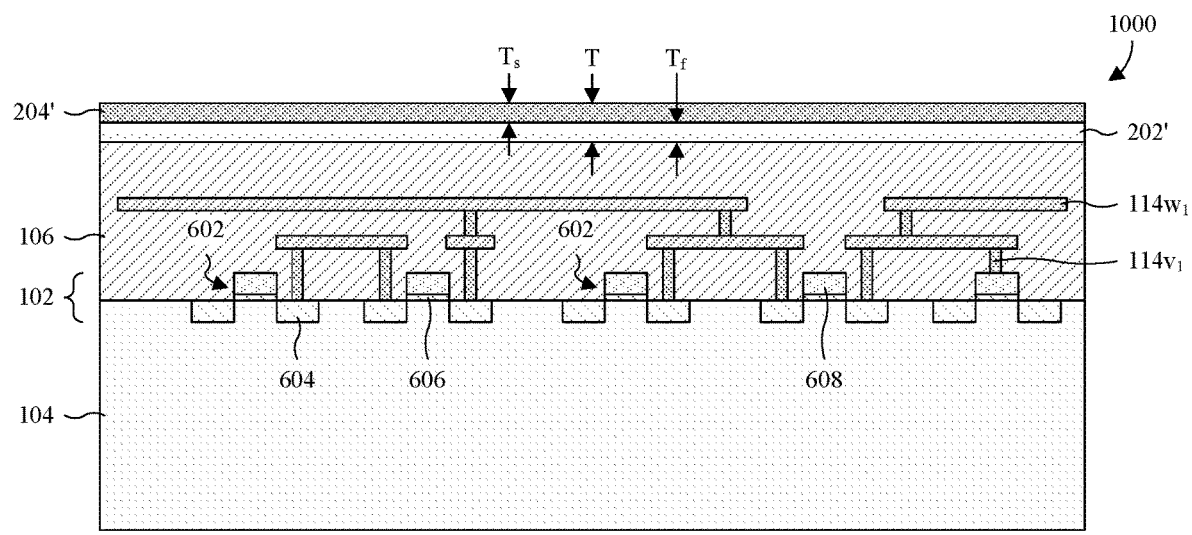

As illustrated by the cross-sectional view 1000 of FIG. 10, a first doping-type layer 202' and a second doping-type layer 204' are transferred to or formed directly on the first ILD layer 106. The first doping-type layer 202' is a semiconductor layer having a first doping type. The second doping-type layer 204' is a semiconductor layer having a second doping type opposite the first doping type, and overlies the first doping-type layer 202'. In some embodiments, the first and second doping-type layers 202', 204' each have a single doping type. Further, in some embodiments, the first and second doping-type layers 202', 204' are devoid of semiconductor junctions and/or have uniform doping concentrations.

In some embodiments, the first doping-type layer 202' is formed with a first thickness $T_f$ between about 3-50 nm, about 1-100 nm, about 10-30 nm, or about 5-15 nm. The first thickness $T_f$ may, for example, be substantially uniform. Further, in some embodiments, the second doping-type layer 204' is formed with a second thickness $T_s$ that between about 3-50 nm, about 1-100 nm, about 10-30 nm, or about 5-15 nm. The second thickness $T_s$ may be, for example, the same as or different than (e.g., greater or less than) the first thickness $T_f$, and/or may, for example, be substantially uniform. Further yet, in some embodiments, a combined thickness T (i.e., $T_f + T_s$) of the first and second doping-type layers 202', 204' is between about 6-100 nm, about 1-50 nm, about 10-30 nm, or about 50-100 nm.

In some embodiments, a process by which the first and second doping-type layers 202', 204' come to lie on the first ILD layer 106 is performed without exposing the structure of FIG. 9 to high temperatures that may damage underlying layers. For example, the process may be performed at temperatures less than about 500 or 600° C., and/or at temperatures less than the annealing temperature at FIG. 8. As another example, the process may, for example, be performed at temperatures between about 350-500° C. and/or between about 400-450° C. In some embodiments where the first and second doping-type layers 202', 204' are formed directly on the first ILD layer 106, the process comprises vapor-phase epitaxy, molecular-beam epitaxy, some other growth or deposition process, or a combination of the foregoing. In some embodiments where the first and second doping-type layers 202', 204' are transferred to the first ILD layer 106, the process comprises: forming the first and second doping-type layers 202', 204' on a remote substrate (not shown) remote from the structure of FIG. 9; bonding the remote substrate to the first ILD layer 106 through the first and second doping-type layers 202', 204'; and removing the remote substrate. Various embodiments are discussed hereafter.

Transferring the first and second doping-type layers 202', 204' to the first ILD layer 106 is preferred over forming the first and second doping-type layers 202', 204' directly on the first ILD layer 106 because it can be more readily performed without exposing the structure of FIG. 9 to high temperatures. For example, when transferring to the first ILD layer 106, the first and second doping-type layers 202', 204' may be formed remote from the structure of FIG. 9 using high temperature processes, and then transferred to the first ILD layer 106 using low temperature bonding. The high temperature processes may include, for example, annealing to activate dopants implanted by ion implantation and/or to repair crystalline damage from the ion implantation. As such, when transferring to the first ILD layer 106, there are few limitations on the processes that may be used to form the first and second doping-type layers 202', 204'. On the other hand, when forming directly on the first ILD layer 106, the forming is limited to low temperature processes so as to not damage underlying layers.

Figure 11A:
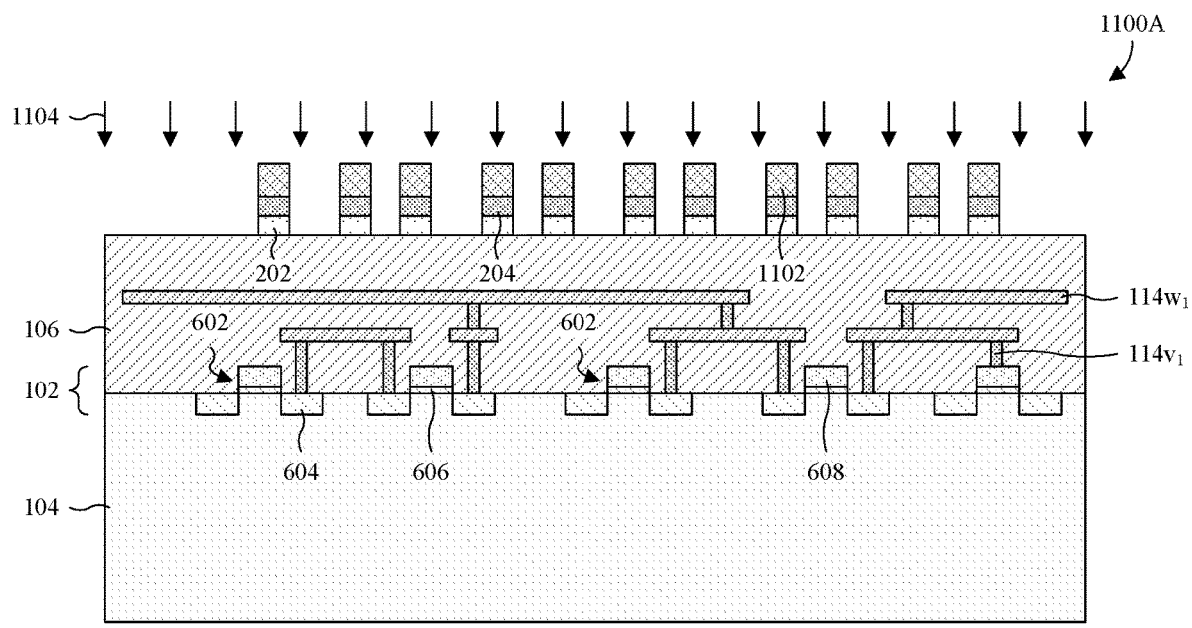
Figure 11B:
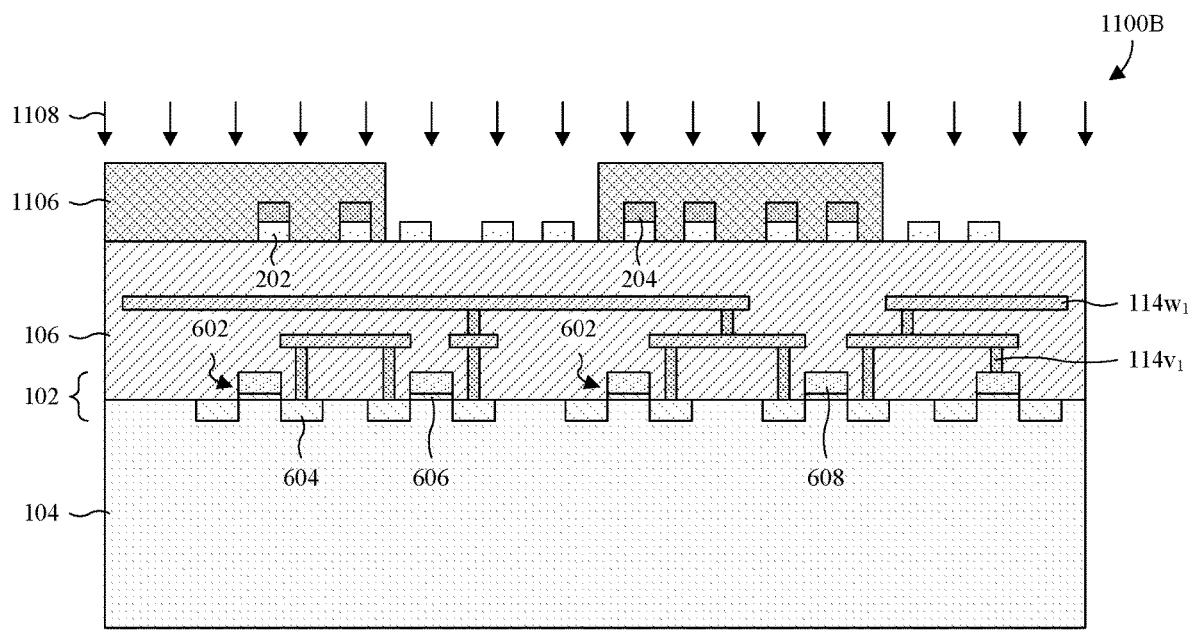

With reference to FIGS. 11A and 11B, first embodiments of a process for forming wires of junctionless semiconductor devices (JSDs) are provided.

As illustrated by the cross-sectional view 1100A of FIG. 11A, a first etch is performed selectively into the first and second doping-type layers 202', 204' (see, e.g., FIG. 10) to define a plurality of first doping-type wires 202, and to further define a plurality of second doping-type wires 204 respectively covering the first doping-type wires 202. For ease of illustration, only one of the first doping-type wires 202 is labeled 202, and only one of the second doping-type wires 204 is labeled 204. As seen hereafter, the first and second doping-type wires 202, 204 correspond to JSDs under manufacture. In some embodiments, the first etch is performed so layouts and/or footprints of the first doping-type wires 202 vary from wire to wire, and/or layouts and/or footprints of the second doping-type wires 204 vary from wire to wire.

In some embodiments, a process for performing the first etch comprises forming a first mask layer 1102 over the first and second doping-type layers 202', 204', and applying a first etchant 1104 to the first and second doping-type layers 202', 204' with the first mask layer 1102 in place until the first and second doping-type wires 202, 204 are formed. Further, in some embodiments, the process comprises removing the first mask layer 1102 after forming the first and second doping-type wires 202, 204. The first mask layer 1102 may be, for example, a hard mask or a photoresist mask, and/or may be, for example, patterned using photolithography.

As illustrated by the cross-sectional view 1100B of FIG. 11B, in some embodiments, a second etch is performed selectively into the second doping-type wires 204 to remove some of the second doping-type wires 204. However, the second etch stops on the first doping-type wires 202 so as to not remove the first doping-type wires 202. As seen hereafter, first doping-type wires uncovered by the second etch define selectively-conductive channels for first doping-type JSDs under manufacture, whereas remaining second doping-type wires define selectively-conductive channels for second doping-type JSDs under manufacture.

In some embodiments, a process for performing the second etch comprises forming a second mask layer 1106 over the second doping-type wires 204, and applying a second etchant 1108 to the second doping-type wires 204 with the second mask layer 1106 in place until some of the second doping-type wires 204 are removed. Further, in some embodiments, the process comprises removing the second mask layer 1106 after removing some of the second doping-type wires 204. The second mask layer 1106 may be, for example, a hard mask or a photoresist mask, and/or may be, for example, patterned using photolithography.

Figure 12A:
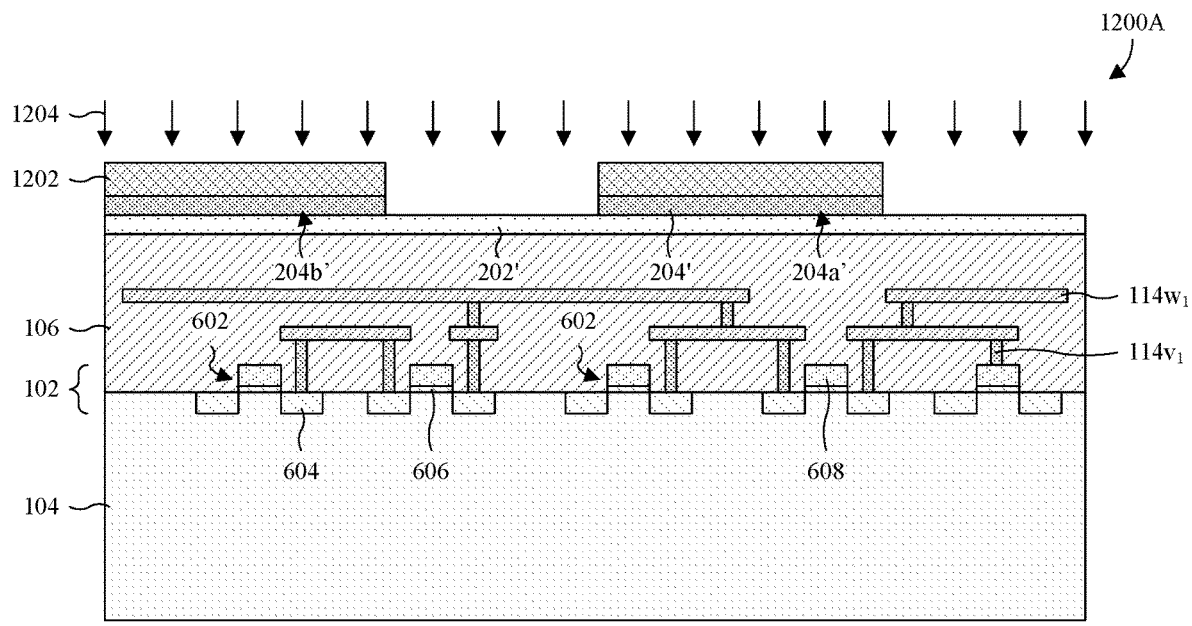
Figure 12B:
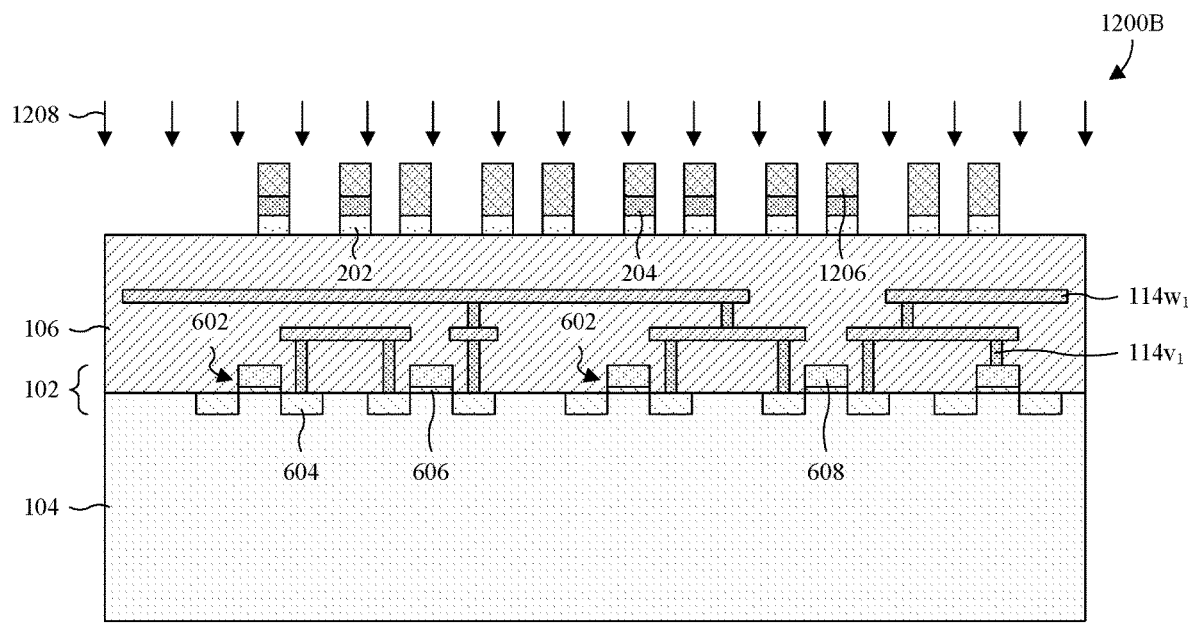

With reference to FIGS. 12A and 12B, second embodiments of the process for forming wires of JSDs are provided. The second embodiments may, for example, be performed in place of the first embodiments of FIGS. 11A and 11B.

As illustrated by the cross-sectional view 1200A of FIG. 12A, a first etch is performed selectively into the second doping-type layer 204', but not the first doping-type layer 202', to divide the second doping-type layer 204' into one or more discrete regions 204a', 204b'. As seen hereafter, second doping-type JSDs under manufacture are formed in the discrete regions 204a', 204b', whereas first doping-type JSDs under manufacture are formed outside the discrete regions 204a', 204b' in the first doping-type layer 202'.

In some embodiments, a process for performing the first etch comprises forming a first mask layer 1202 over the second doping-type layer 204', and applying a first etchant 1204 to the second doping-type layer 204' with the first mask layer 1202 in place until the first doping-type layer 202' is reached. Further, in some embodiments, the process comprises removing the first mask layer 1202 after applying the first etchant 1204. The first mask layer 1202 may be, for example, a hard mask or a photoresist mask, and/or may be, for example, patterned using photolithography.

As illustrated by the cross-sectional view 1200B of FIG. 12B, a second etch is performed selectively into the first and second doping-type layers 202', 204' (see, e.g., FIG. 12A) to define a plurality of first doping-type wires 202, and to further define a plurality of second doping-type wires 204 respectively covering some of the first doping-type wires 202. For ease of illustration, only one of the first doping-type wires 202 is labeled 202, and only one of the second doping-type wires 204 is labeled 204. As seen hereafter, the first and second doping-type wires 202, 204 correspond to JSDs under manufacture. In some embodiments, the second etch is performed so layouts and/or footprints of the first doping-type wires 202 vary from wire to wire, and/or layouts and/or footprints of the second doping-type wires 204 vary from wire to wire.

In some embodiments, a process for performing the second etch comprises forming a second mask layer 1206 over the first and second doping-type layers 202', 204', and applying a second etchant 1208 to the first and second doping-type layers 202', 204' with the second mask layer 1206 in place until the first and second doping-type wires 202, 204 are formed. Further, in some embodiments, the process comprises removing the second mask layer 1206 after forming the first and second doping-type wires 202, 204. The second mask layer 1206 may be, for example, a hard mask or a photoresist mask, and/or may be, for example, patterned using photolithography.

Figure 13:
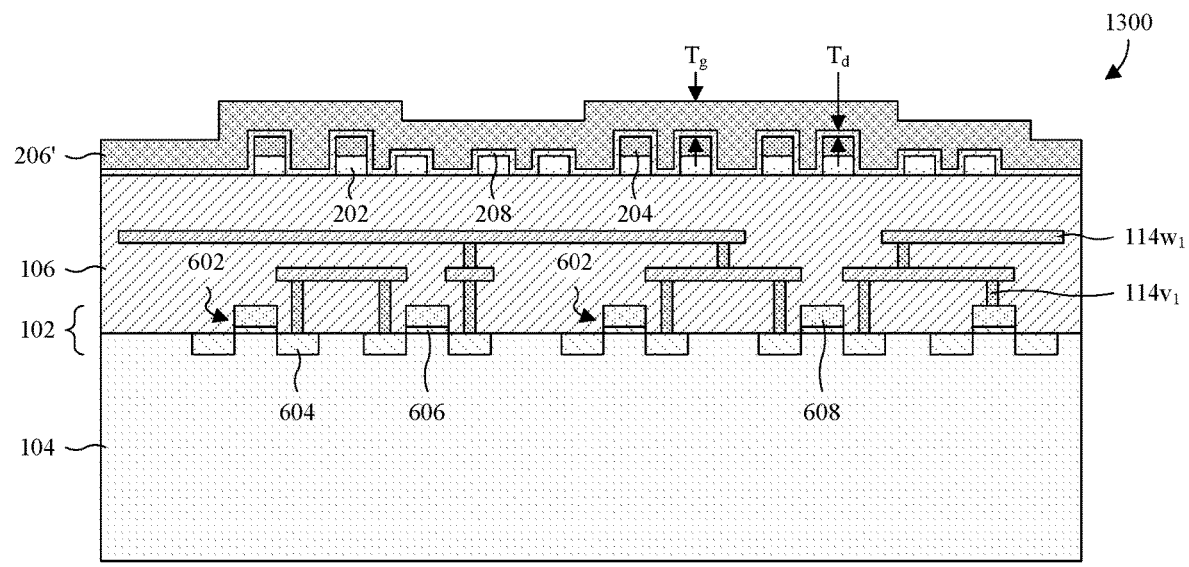

As illustrated by the cross-sectional view 1300 of FIG. 13, a gate dielectric layer 208 and a gate electrode layer 206' are formed stacked over and lining the first and second doping-type wires 202, 204. Further, the gate electrode layer 206' is formed over the gate dielectric layer 208. In some embodiments, the gate dielectric layer 208 and the gate electrode layer 206' are conformal and/or have substantially uniform thicknesses $T_g$, $T_d$.

In some embodiments, a process for forming the gate dielectric layer 208 comprises thermal oxidation, vapor depositing, atomic layer deposition, some other growth or deposition process, or a combination of the foregoing. Further, in some embodiments, a process for forming the gate electrode layer 206' comprises electroless plating, electroplating, vapor deposition, atomic layer deposition some other growth or deposition process, or a combination of the foregoing. In some embodiments, the processes for forming the gate dielectric layer 208 and the gate electrode layer 206' are performed at low temperatures. The low temperatures may include, for example, temperatures less than about 500 or 400° C., and/or less than the annealing temperature at FIG. 8. Further, the low temperatures may, for example, be between about 350-500° C. and/or between about 400-450° C.

Figure 14:
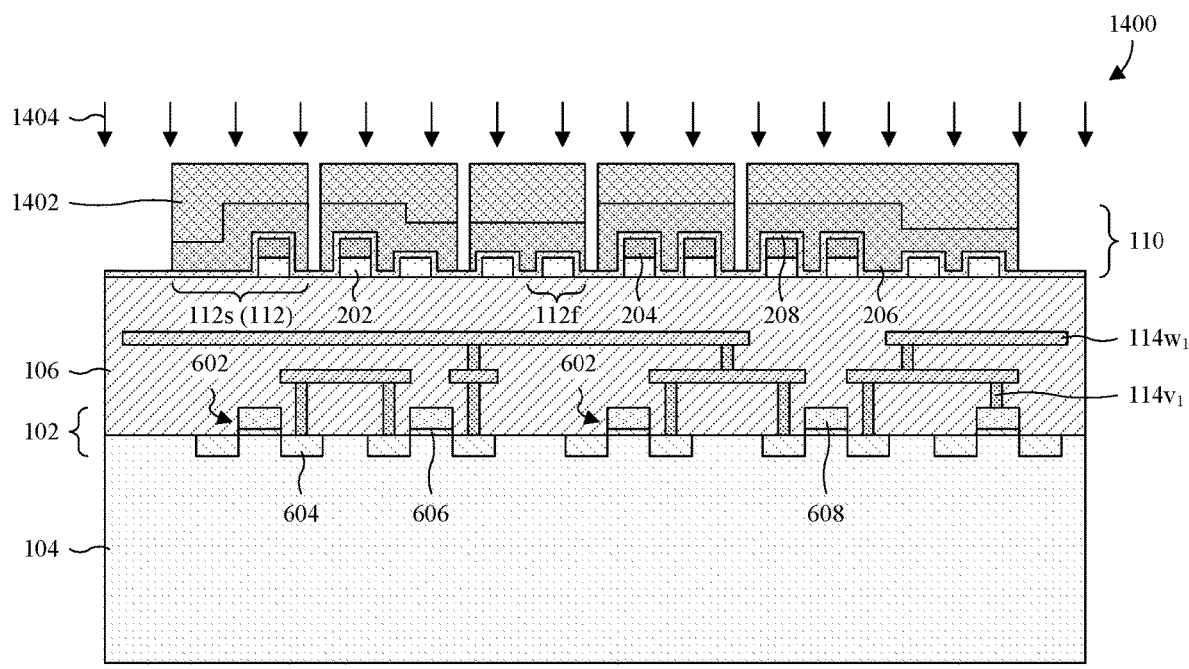

As illustrated by the cross-sectional view 1400 of FIG. 14, a third etch is performed selectively into the gate electrode layer 206' (see, e.g., FIG. 13) and, in some embodiments, the gate dielectric layer 208 to form gate electrodes 206. The gate electrodes 206, as well as the first and second doping-type wires 202, 204, collectively define JSDs 112 making up a second device layer 110. For ease of illustration, only one of the gate electrodes 206 is labeled 206, and only one of the JSDs 112 is labeled 112. The JSDs 112 comprise first doping-type JSDs 112f and/or second doping-type JSDs 112s. For ease of illustration, only one of the first doping-type JSDs 112f is labeled 112f, and only one of the second doping-type JSDs 112s is labeled 112s.

In some embodiments, a process for performing the third etch comprises forming a third mask layer 1402 over the gate electrode layer 206', and applying a third etchant 1404 to the gate electrode layer 206' with the third mask layer 1402 in place until the gate electrodes 206 are formed. Further, in some embodiments, the process comprises removing the third mask layer 1402 after forming the gate electrodes 206. The third mask layer 1402 may be, for example, a hard mask or a photoresist mask, and/or may be, for example, patterned using photolithography.

Advantageously, since the JSDs 112 are junctionless, there is no ion implantation into the first and second doping-type wires 202, 204 (e.g., to form source/drain regions) after forming the gate electrodes 206. As such, there is no high temperature anneal to activate implanted dopants and/or to repair crystalline damage after forming the gate electrodes 206. Accordingly, the JSDs 112 may be formed at low temperatures and without exposing underlying layers to high temperature processes, which may damage the underlying layers. The low temperatures may include, for example, temperatures less than about 500 or 400° C., and/or less than the annealing temperature at FIG. 8. Further, the low temperatures may, for example, be between about 350-500° C. and/or between about 400-450° C.

Figure 15:
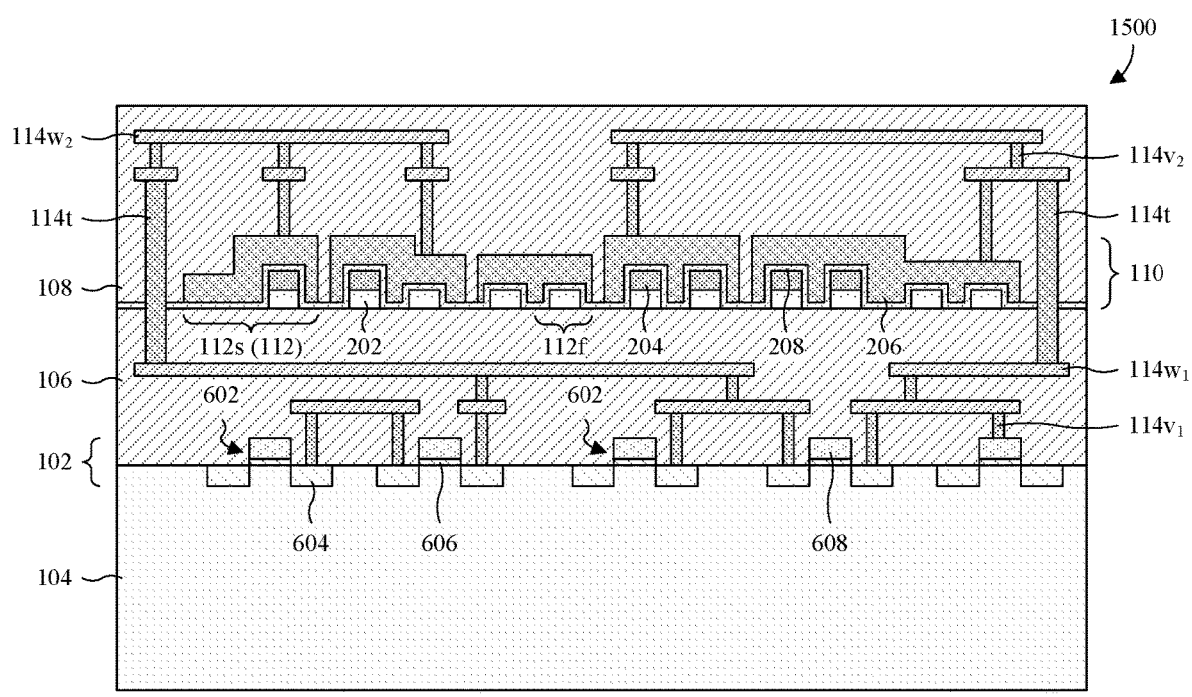

As illustrated by the cross-sectional view 1500 of FIG. 15, a second ILD layer 108 is formed covering the second device layer 110 and the first ILD layer 106, while second interconnect wires $114w_2$ and second vias $114v_2$ are formed alternatingly stacked in the second ILD layer 108. For ease of illustration, only one of the second interconnect wires $114w_2$ is labeled $114w_2$, and only one of the second vias $114v_2$ is labeled $114v_2$. Further, the second interconnect wires $114w_2$ and the second vias $114v_2$ are formed electrically coupled to the second device layer 110, as well as the first interconnect wires $114w_1$ and the first vias $114v_1$. The second vias $114v_2$ comprise TDVs 114t extending through the second device layer 110 to the first interconnect wires $114w_1$ to electrically couple the second interconnect wires $114w_2$ to the first interconnect wires $114w_1$.

In some embodiments, the second interconnect wires $114w_2$ and the second vias $114v_2$ are formed as described for the first interconnect wires $114w_1$ and the first vias $114v_1$ with regard to FIG. 9. Further, in some embodiments, a process for forming the TDVs 114t comprises performing an etch through a portion of the second ILD layer 108, the gate dielectric layer 208, and a portion of the first ILD layer 106 to form TDV openings exposing interconnect wires, and subsequently filling the TDV openings with a conductive material.

Figure 16:
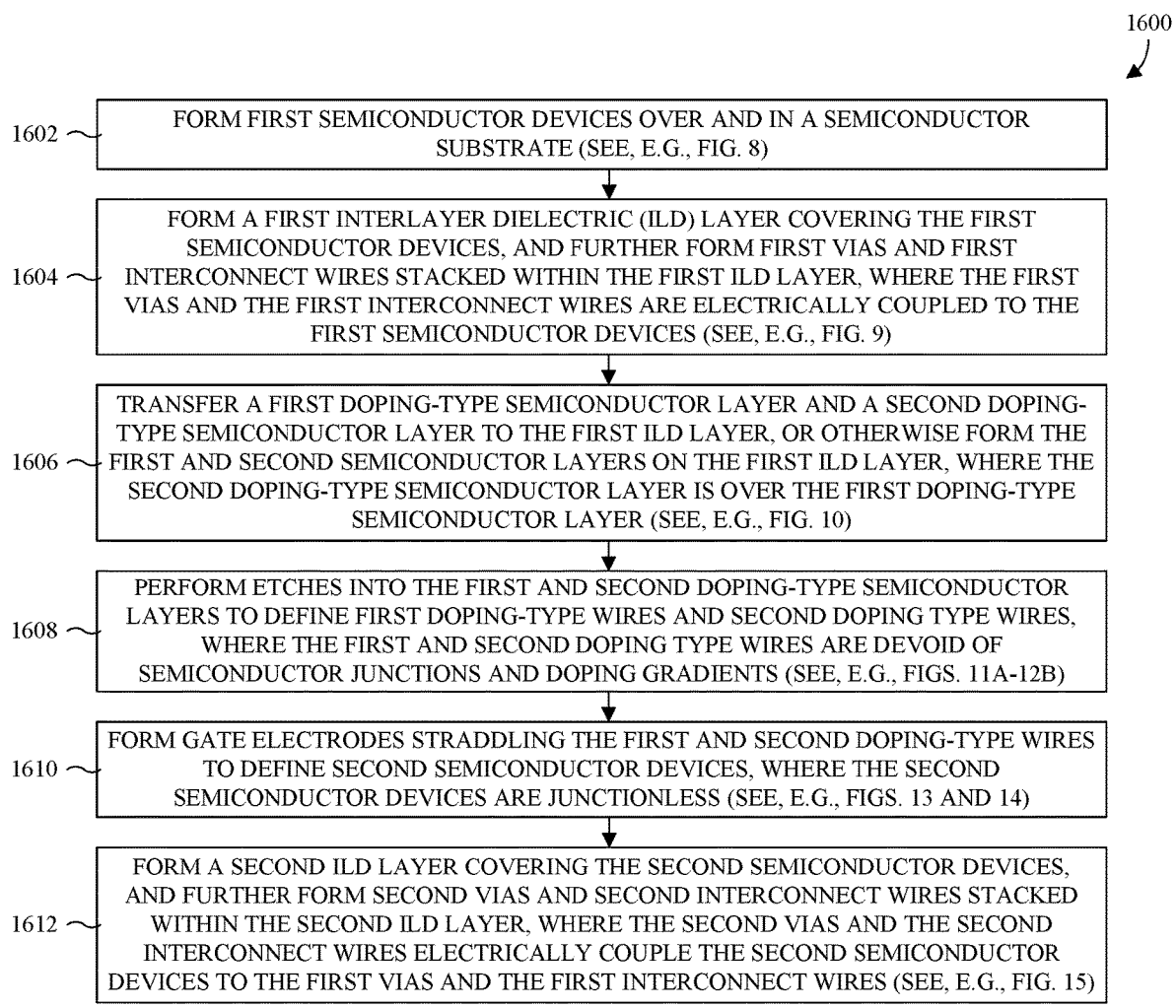
FIG. 16 illustrates a flowchart of some embodiments of the method of FIGS. 8-10, 11A, 11B, 12A, 12B, and 13-15.

With reference to FIG. 16, a flowchart 1600 of some embodiments of the method of FIGS. 8-10, 11A, 11B, 12A, 12B, and 13-15 is provided.

At 1602, first semiconductor devices are formed over and in a semiconductor substrate. See, for example, FIG. 8.

At 1604, a first ILD layer is formed covering the first semiconductor devices. Further, first vias and first interconnect wires are formed stacked within the first ILD layer, where the first vias and the first interconnect wires are electrically coupled to the first semiconductor devices. See, for example, FIG. 9.

At 1606, a first doping-type semiconductor layer and a second doping-type semiconductor layer are transferred to the first ILD layer, or otherwise formed on the first ILD layer. Further, the second doping-type semiconductor layer is over the first doping-type semiconductor layer. See, for example, FIG. 10. Various embodiments of the transfer are described hereafter. The transferring may advantageously be performed at low temperatures that don't damage underlying layers.

At 1608, etches are performed into the first and second doping-type semiconductor layers to define first doping-type wires and second doping type wires, where the first and second doping type wires are devoid of semiconductor junctions and doping gradients. The semiconductor junctions include, for example, heterojunctions, Schottky junctions, and PN junctions. See, for example, FIGS. 11A-12B.

At 1610, gate electrodes are formed straddling the first and second doping-type wires to define second semiconductor devices, where the second semiconductor devices are junctionless. See, for example, FIGS. 13 and 14. Advantageously, ion implantation and annealing are not performed to form source/drain regions after the gate electrode are formed. This, in turn, allows the second semiconductor devices to be formed at low temperatures and without damaging underlying layers.

At 1612, a second ILD layer is formed covering the second semiconductor devices. Further, second vias and second interconnect wires are formed stacked within the second ILD layer, where the second vias and the second interconnect wires electrically couple the second semiconductor devices to the first vias and interconnect wires. See, for example, FIG. 15.

While the flowchart 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 17A-17E, a series of cross-sectional views 1700A-1700E of first embodiments of a process for transferring a first doping-type layer and a second doping-type layer to a substrate is provided. These embodiments and other embodiments described hereafter may, for example, be used to perform the actions of FIG. 10 and/or act 1606 in FIG. 16, such that the substrate may be the first ILD layer 106 of FIG. 9.

Figure 17A:
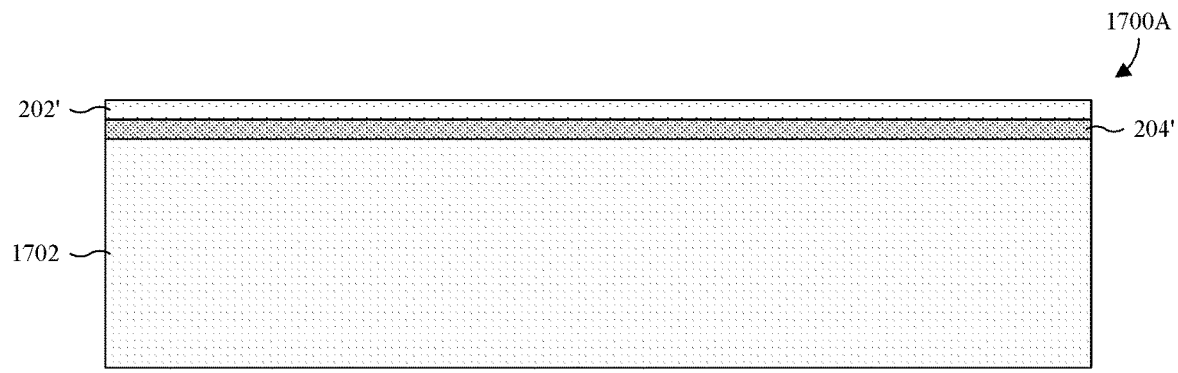
FIGS. 17A-17E illustrate a series of cross-sectional views of first embodiments of a method for transferring a first doping-type layer and a second doping-type layer to a substrate.

As illustrated by the cross-sectional view 1700A of FIG. 17A, a first doping-type layer 202' and a second doping-type layer 204' are formed stacked on a carrier substrate 1702, where the first doping-type layer 202' overlies the second doping-type layer 204'. The carrier substrate 1702 may be, for example, a bulk semiconductor substrate (e.g., of monocrystalline silicon) or some other type of substrate. The first and second doping-type layers 202', 204' are formed with opposite doping types. Further, in some embodiments, the first and second doping-type layers 202', 204' are formed by vapor-phase epitaxy, molecular-beam epitaxy, some other growth or deposition process, or a combination of the foregoing.

Figure 17B:
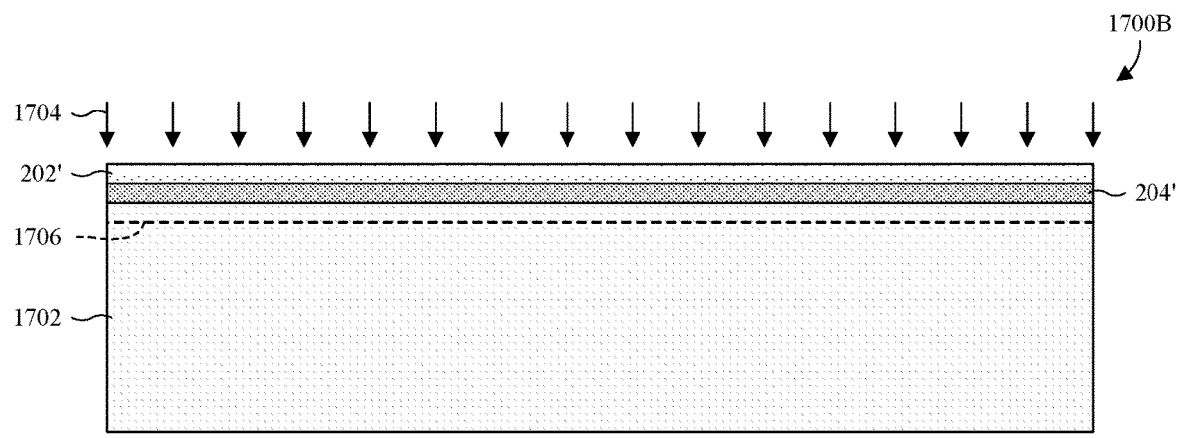

As illustrated by the cross-sectional view 1700B of FIG. 17B, hydrogen ions 1704 are implanted into the carrier substrate 1702, through the first and second doping-type layers 202', 204', to define a hydrogen-rich region 1706 of the carrier substrate 1702 that is spaced under the first and second doping-type layers 202', 204'. In some embodiments, the hydrogen ions 1704 are implanted by ion implantation. Further, in some embodiments, an annealing process is performed after implanting the hydrogen ions 1704 to repair crystalline damage to the first and second doping-type layers 202', 204' and/or to the carrier substrate 1702.

Figure 17C:
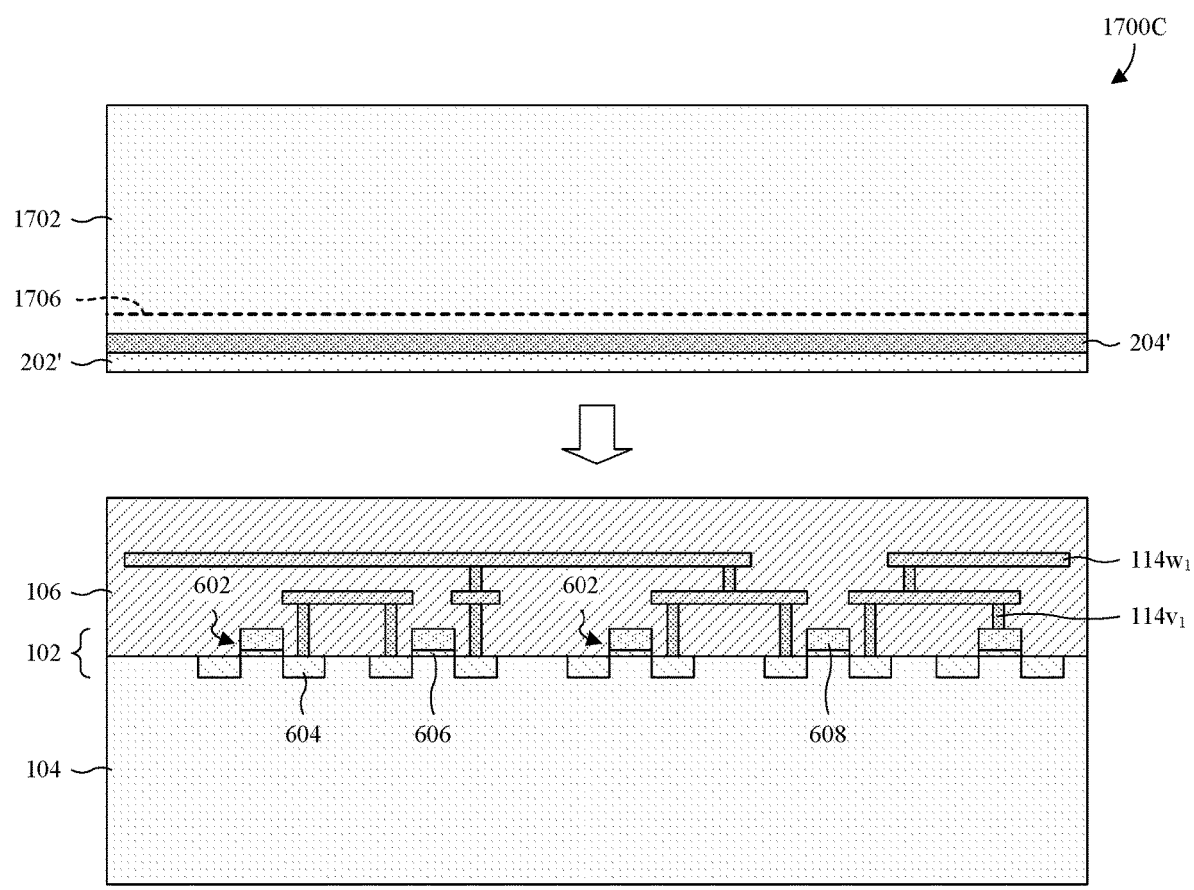

As illustrated by the cross-sectional view 1700C of FIG. 17C, the structure of FIG. 17B is flipped vertically and bonded to a first ILD layer 106 and/or the structure in FIG. 9. In some embodiments, the bonding is performed by, for example, a fusion bonding process.

Figure 17D:
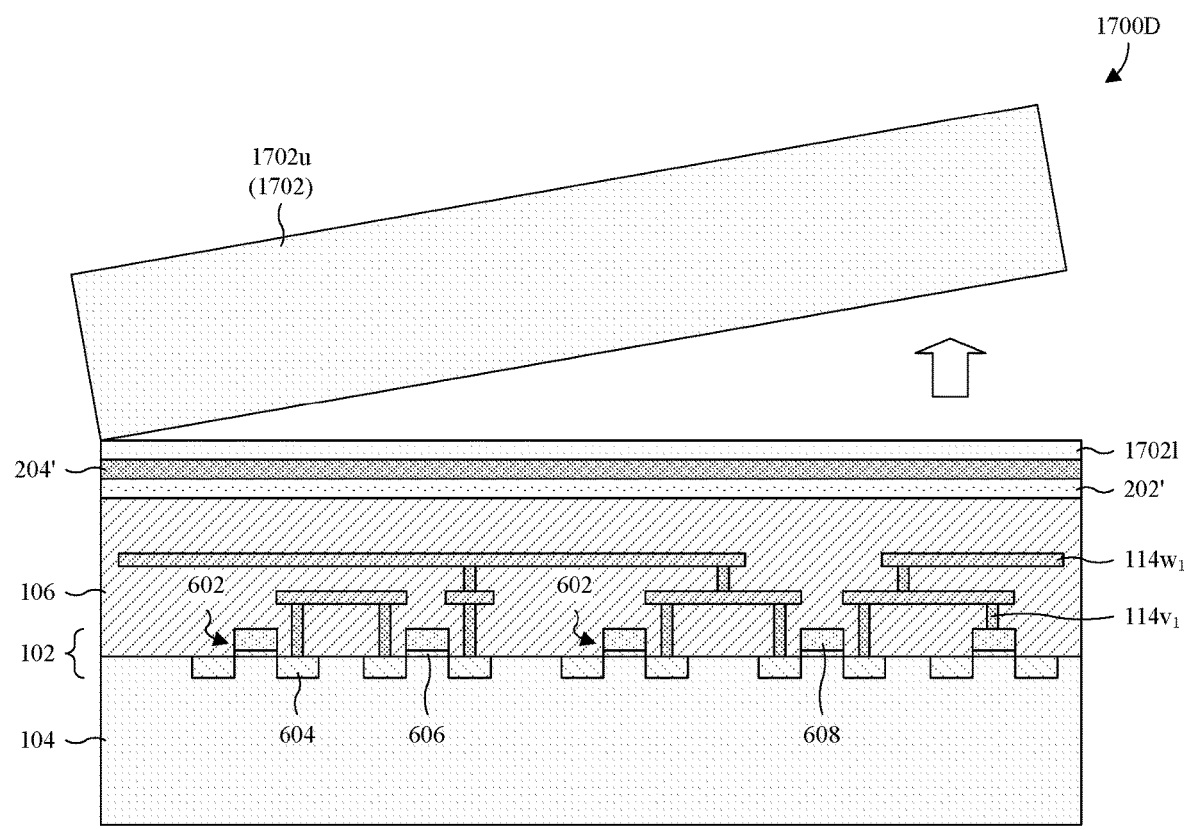

As illustrated by the cross-sectional view 1700D of FIG. 17D, an upper portion 1702u of the carrier substrate 1702 is broken off of a lower portion 1702l of the carrier substrate 1702, while the lower portion 1702l remains bonded to the first ILD layer 106. The upper and lower portions 1702u, 1702l are demarcated by the hydrogen-rich region 1706 (see, e.g., FIG. 17C) of the carrier substrate 1702, which advantageously weakens the carrier substrate 1702 to allow the upper portion 1702u to be readily broken off of the lower portion 1702l by, for example, application of mechanical force to the carrier substrate 1702.

Figure 17E:
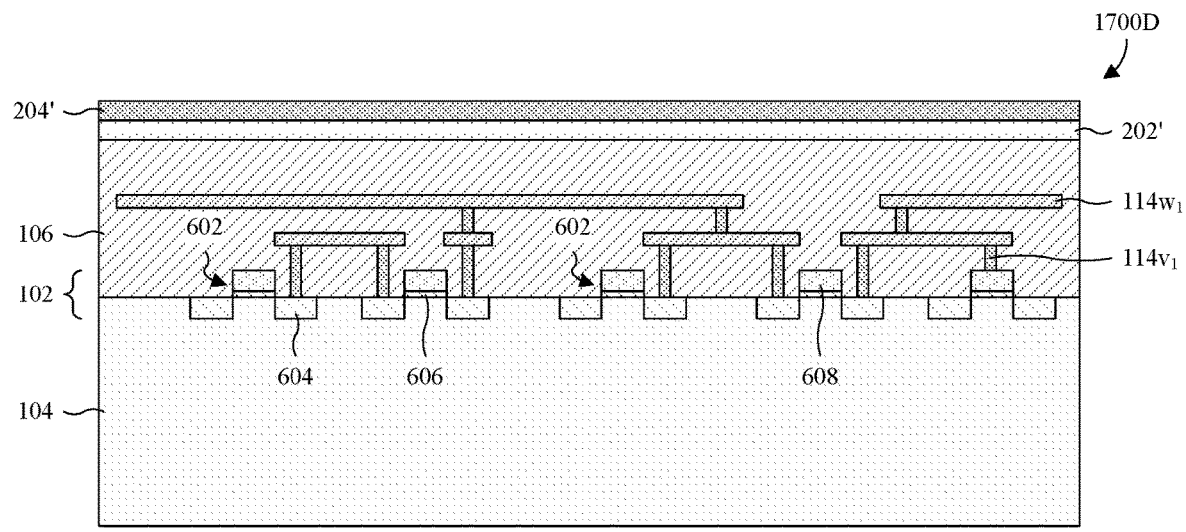

As illustrated by the cross-section view 1700E of FIG. 17E, the lower portion 1702l of the carrier substrate 1702 (see, e.g., FIG. 17D) is removed. In some embodiments, the lower portion 1702l is removed by an etch and/or a planarization into the lower portion 1702l. The planarization may, for example, be performed by a CMP.

With reference to FIGS. 18A-18E, a series of cross-sectional views 1800A-1800E of second embodiments of the process for transferring a first doping-type layer and a second doping-type layer to a substrate is provided.

Figure 18A:
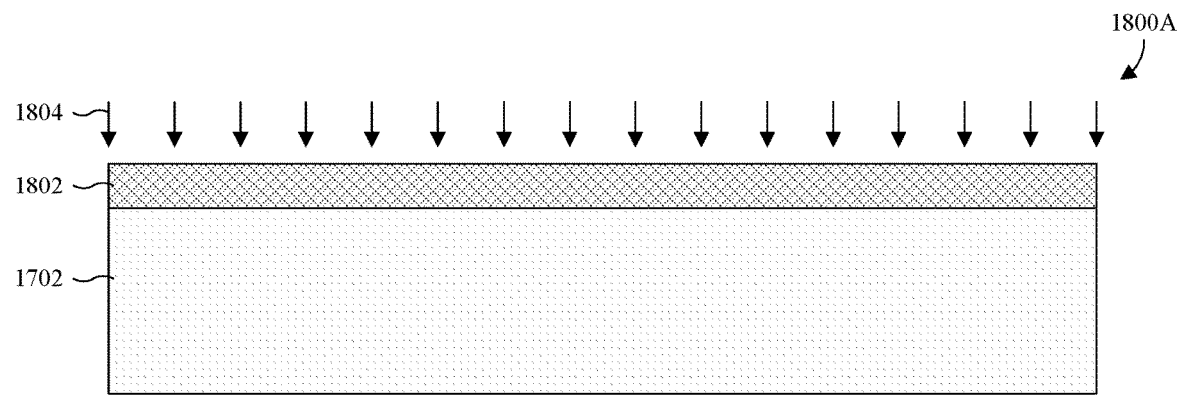
FIGS. 18A-18E illustrate a series of cross-sectional views of second embodiments of the method of FIGS. 17A-17E.

As illustrated by the cross-sectional view 1800A of FIG. 18A, a porous semiconductor layer 1802 is formed on a carrier substrate 1702. The porous semiconductor layer 1802 may be, for example, porous silicon where the carrier substrate is silicon (e.g., monocrystalline silicon). In some embodiments, the process for forming the porous semiconductor layer 1802 comprises performing an etch into the carrier substrate 1702. The etch may, for example, be performed by applying a solution 1804 of hydrofluoric acid to the carrier substrate 1702, and subsequently activating the hydrofluoric acid while the solution 1804 is on the carrier substrate 1702. The hydrofluoric acid may, for example, be activated by applying a sufficient voltage to the solution 1804; by adding an oxidant with a sufficient standard electrode potential to the solution 1804; or by irradiating the solution 1804 with a laser or lamp with a sufficiently short wavelength to excite electrons in the solution 1804 and/or the carrier substrate 1702 to the conduction band.

Figure 18B:
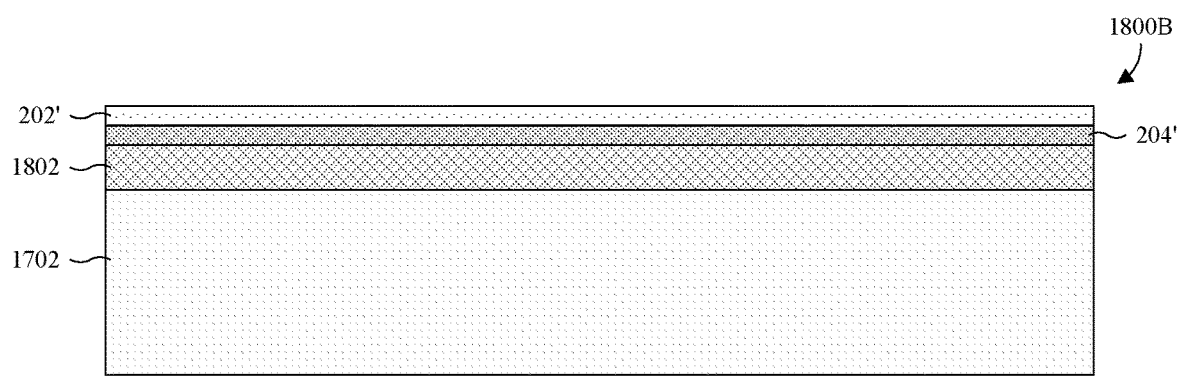

As illustrated by the cross-sectional view 1800B of FIG. 18B, a first doping-type layer 202' and a second doping-type layer 204' are formed stacked on the porous semiconductor layer 1802 of the carrier substrate 1702, where the first doping-type layer 202' overlies the second doping-type layer 204'. The first and second doping-type layer 202' may, for example, be formed as described in FIG. 17A.

Figure 18C:
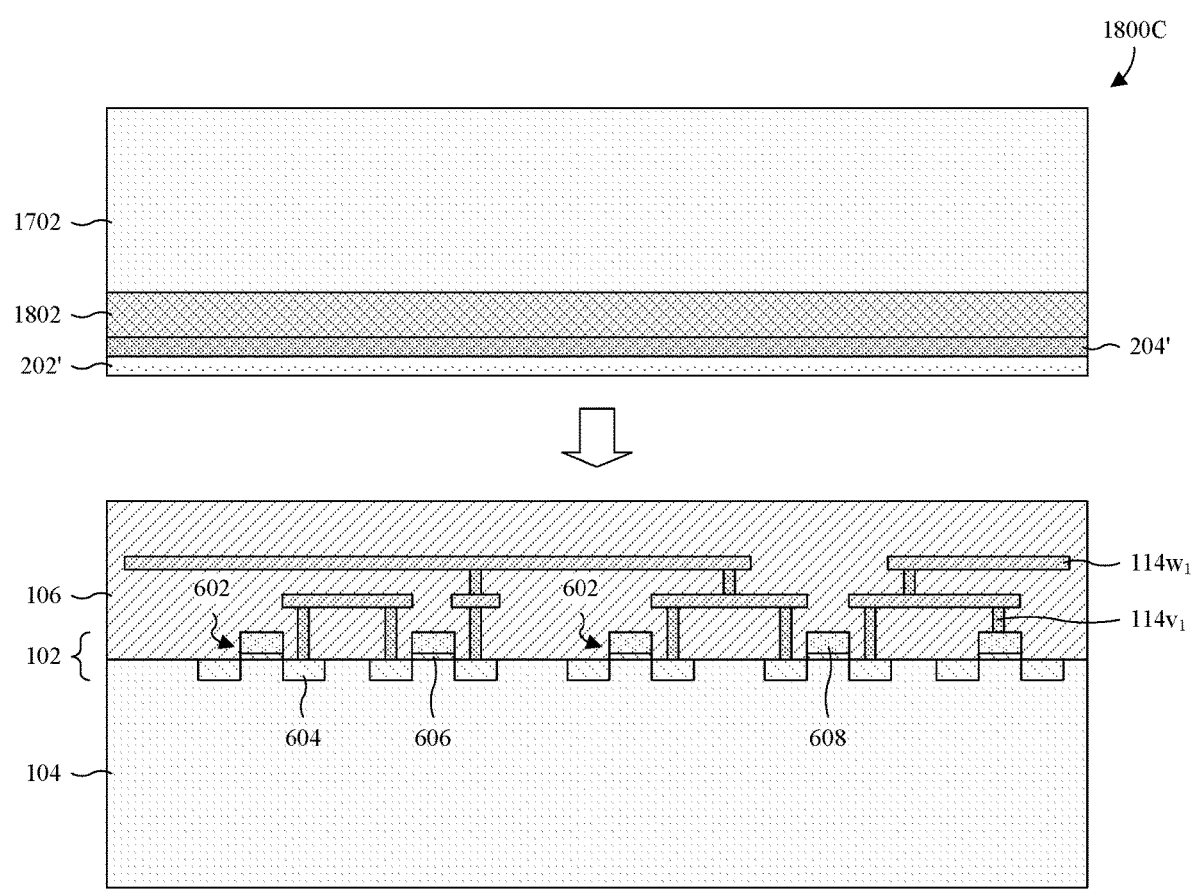

As illustrated by the cross-sectional view 1800C of FIG. 18C, the structure of FIG. 18B is flipped vertically and bonded to a first ILD layer 106 and/or the structure in FIG. 9. In some embodiments, the bonding is performed by, for example, a fusion bonding process.

Figure 18D:
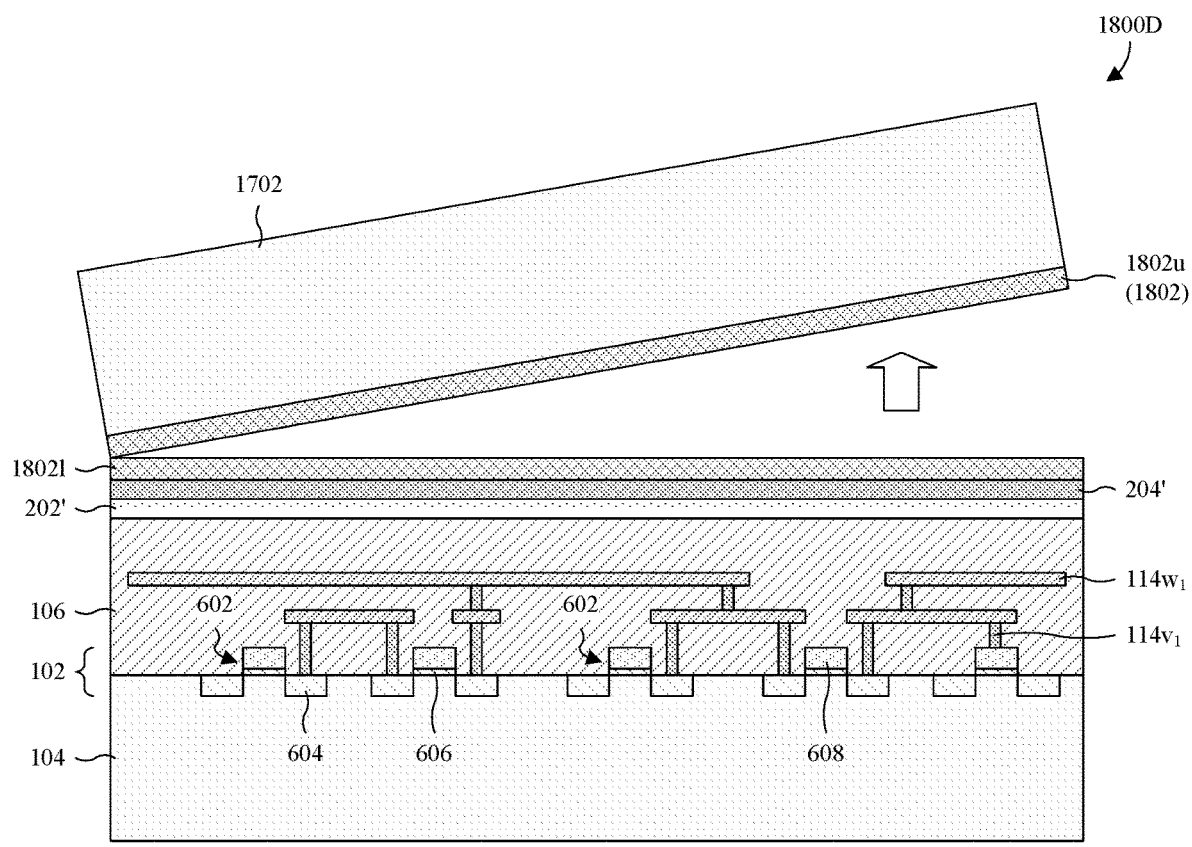

As illustrated by the cross-sectional view 1800D of FIG. 18D, the carrier substrate 1702 and an upper portion 1802u of the porous semiconductor layer 1802 are removed from the first ILD layer 106, while a lower portion 1802l of the porous semiconductor layer 1802 remains bonded to the first ILD layer 106. In some embodiments, a process for removing the carrier substrate 1702 and the upper portion 1802u of the porous semiconductor layer 1802 comprises cutting the porous semiconductor layer 1802 to define the upper and lower portions 1802u, 1802l. The cutting may, for example, be performed with a water jet.

Figure 18E:
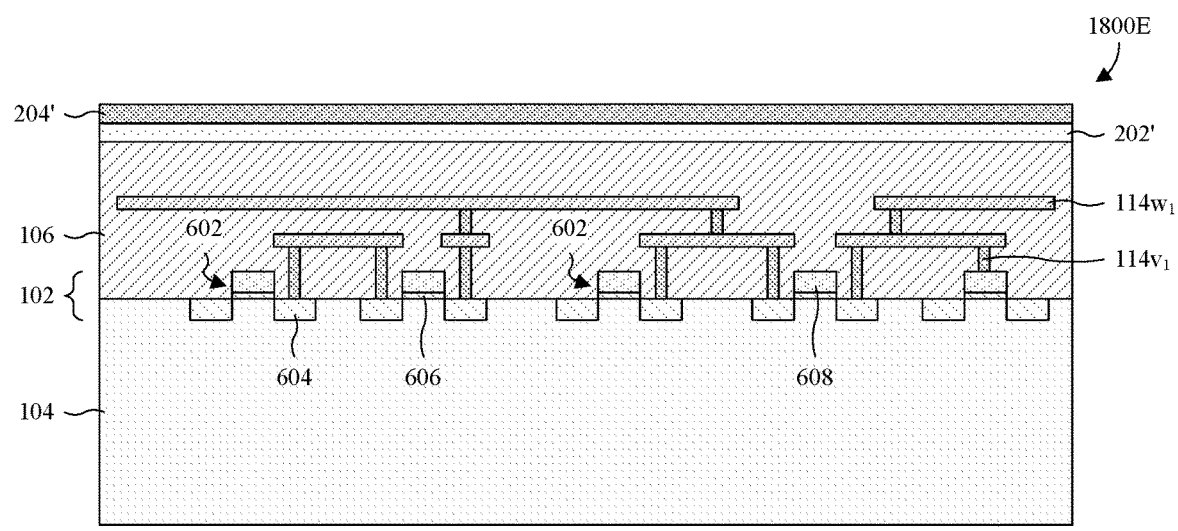

As illustrated by the cross-sectional view 1800E of FIG. 18E, the lower portion 1802l of the porous semiconductor layer 1802 (see, e.g., FIG. 18D) is removed. In some embodiments, the lower portion 1802l is removed by an etch and/or a planarization into the lower portion 1802l. The planarization may, for example, be performed by a CMP.

With reference to FIGS. 19A-19D, a series of cross-sectional views 1900A-1900D of third embodiments of the process for transferring a first doping-type layer and a second doping-type layer to a substrate is provided.

Figure 19A:
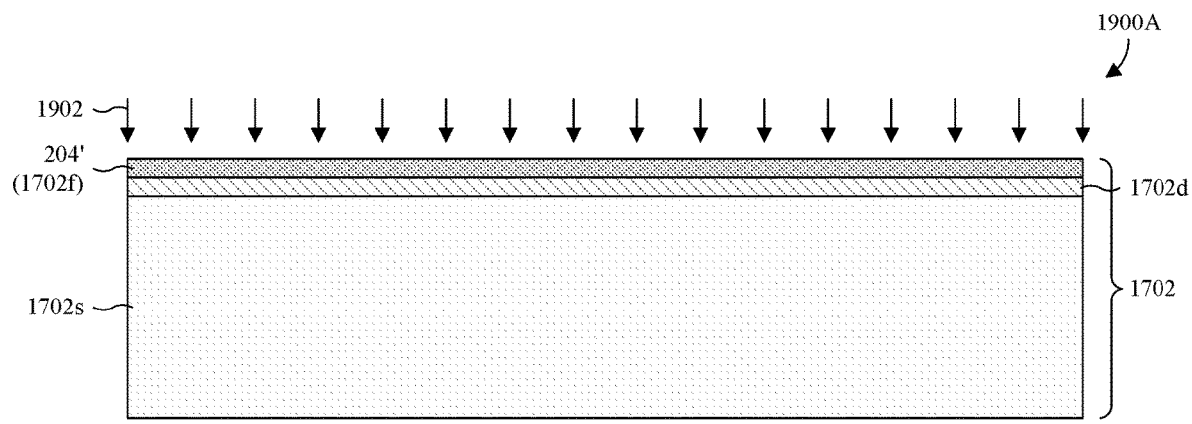
FIGS. 19A-19D illustrate a series of cross-sectional views of third embodiments of the method of FIGS. 17A-17E.

As illustrated by the cross-sectional view 1900A of FIG. 19A, a carrier substrate 1702 is a semiconductor-on-insulator (SOI) substrate, and comprises a first semiconductor layer 1702f, a second semiconductor layer 1702s under the first semiconductor layer 1702f, and a dielectric layer 1702d between the first and second semiconductor layers 1702f, 1702s. The first and second semiconductor layers 1702f, 1702s may be, for example, silicon (e.g., monocrystalline silicon) or some other type of semiconductor. The dielectric layer 1702d may be, for example, an oxide (e.g., silicon dioxide).

Also illustrated by the cross-sectional view 1900A of FIG. 19A, dopants 1902 of a second doping type are implanted into the first semiconductor layer 1702f to define a second doping-type layer 204' on the dielectric layer 1702d. The dopants 1902 may, for example, be implanted by ion implantation. Further, in some embodiments, an anneal is performed to repair crystalline damage to the first semiconductor layer 1702f by the ion implantation.

Figure 19B:
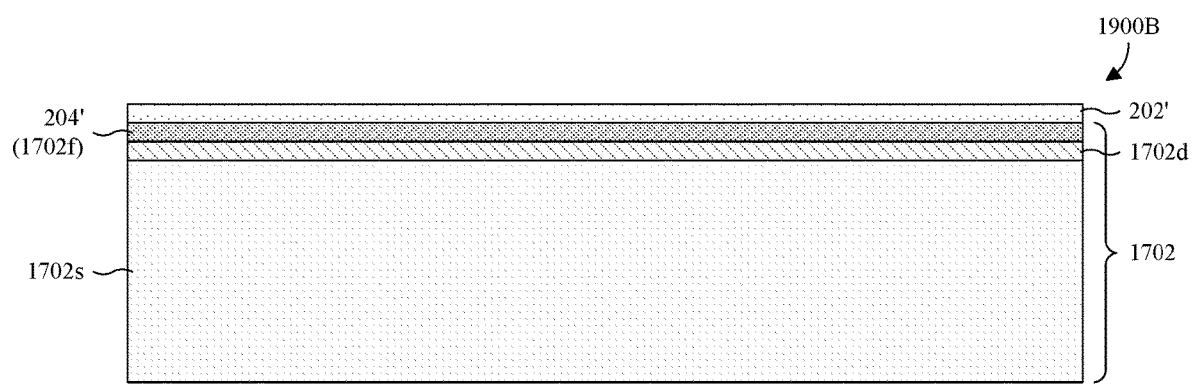

As illustrated by the cross-sectional view 1900B of FIG. 19B, a first doping-type layer 202' is formed on the second doping-type layer 204'. The first doping-type layer 202' has a first doping type opposite the second doping type, and may, for example, be formed by epitaxy and/or as described in FIG. 17A.

Figure 19C:
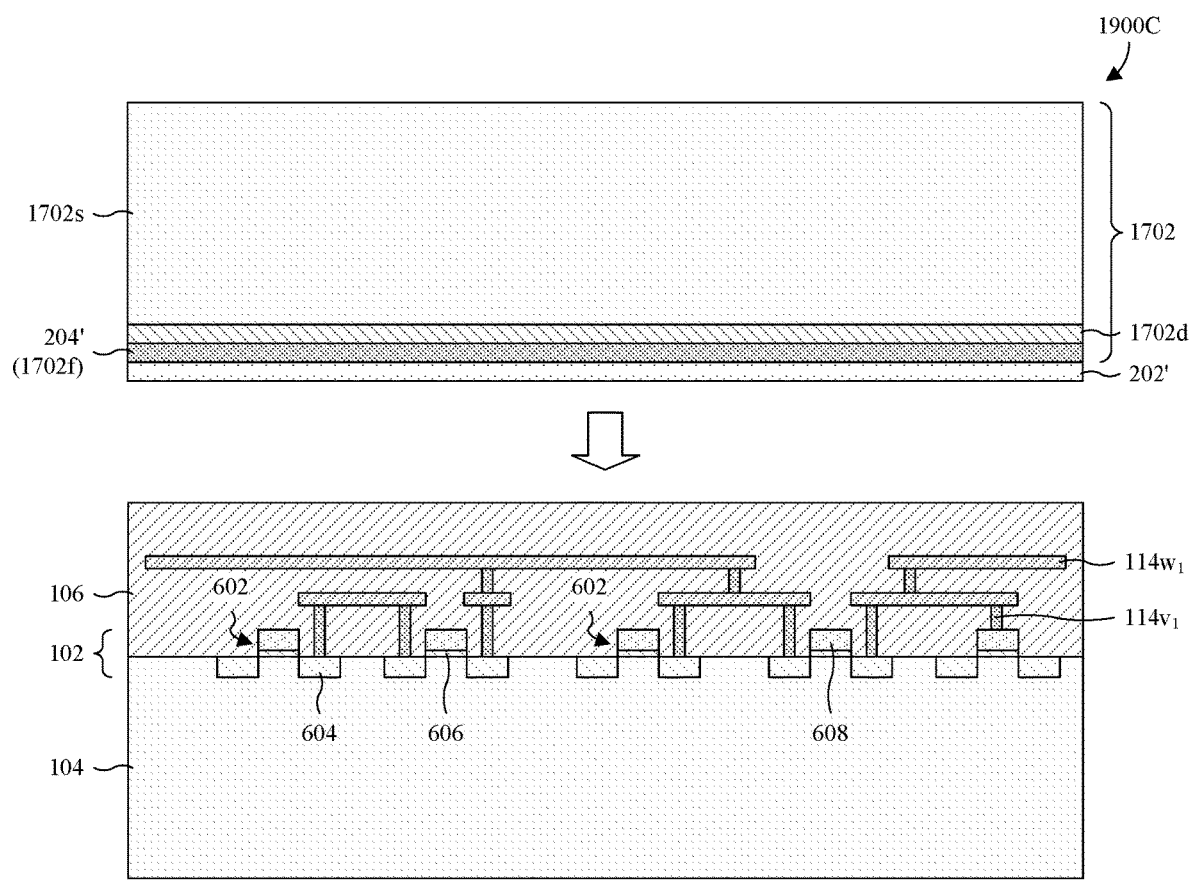

As illustrated by the cross-sectional view 1900C of FIG. 19C, the structure of FIG. 19B is flipped vertically and bonded to a first ILD layer 106 and/or the structure in FIG. 9. In some embodiments, the bonding is performed by, for example, a fusion bonding process.

Figure 19D:
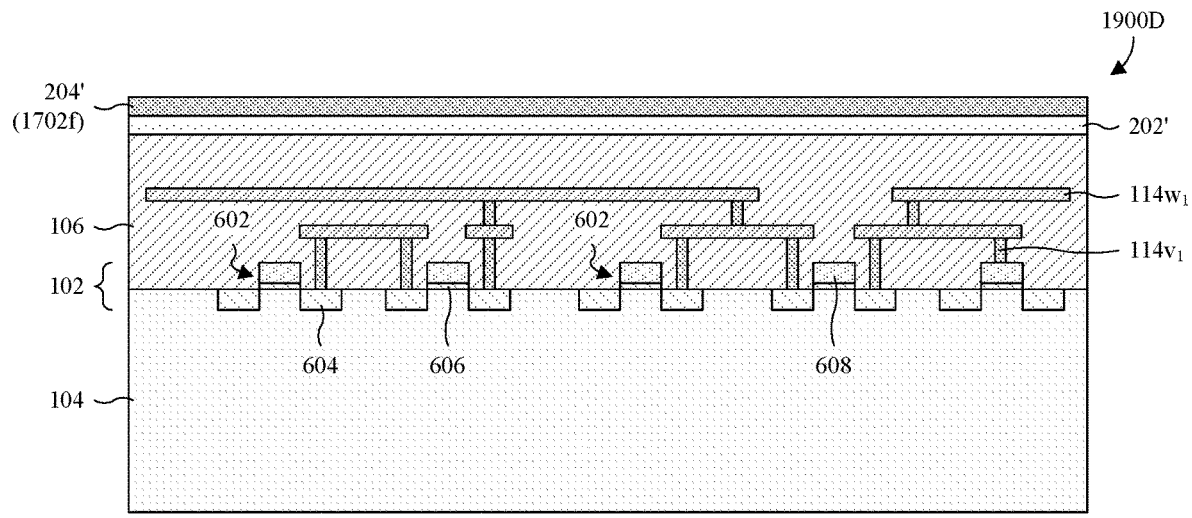

As illustrated by the cross-sectional view 1900D of FIG. 19D, the second semiconductor layer 1702s and the dielectric layer 1702d are removed. In some embodiments, the second semiconductor layer 1702s and the dielectric layer 1702d are removed by an etch and/or a planarization into the second semiconductor layer 1702s and the dielectric layer 1702d. The planarization may, for example, be performed by a CMP.

Figure 20:
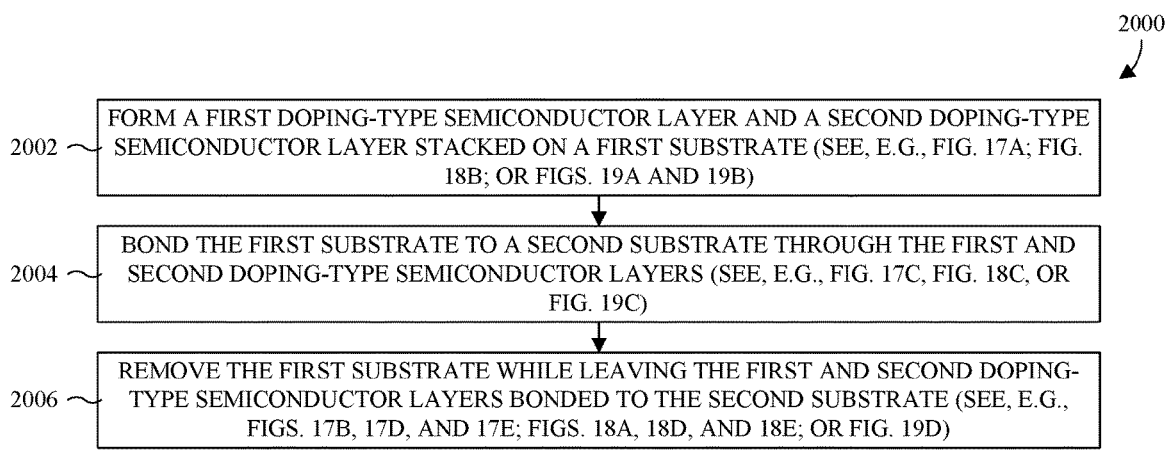
FIG. 20 illustrates a flowchart of some embodiments of the method of FIGS. 17A-17E, 18A-18E, and 19A-19D.

With reference to FIG. 20, a flowchart 2000 of some embodiments of the method of FIGS. 17A-19D is provided.

At 2002, a first doping-type semiconductor layer and a second doping-type semiconductor layer are formed stacked on a first substrate. See, for example, FIG. 17A; FIG. 18B; or FIGS. 19A and 19B.

At 2004, the first substrate is bonded to a second substrate through the first and second doping-type semiconductor layers. See, for example, FIG. 17C, FIG. 18C, or FIG. 19C.

At 2006, the first substrate is removed while leaving the first and second doping-type semiconductor layers bonded to the second substrate. See, for example, FIGS. 17B, 17D, and 17E; FIGS. 18A, 18D, and 18E; or FIG. 19D.

While the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide a method for manufacturing an IC. A first ILD layer is formed over a semiconductor substrate, while also forming first vias and first interconnect wires alternatingly stacked in the first ILD layer. A first doping-type layer and a second doping-type layer are transferred to a top surface of the first ILD layer. The first and second doping-type layers are stacked and are semiconductor material with opposite doping types. The first and second doping-type layers are patterned to form a first doping-type wire and a second doping-type wire overlying the first doping-type wire. A gate electrode is formed straddling the first and second doping-type wires. The gate electrode and the first and second doping-type wires at least partially define a JSD.

Further, other embodiments of the present application provide an IC. A first ILD layer covers a semiconductor substrate. First vias and first interconnect wires are alternatingly stacked within the first ILD layer. A semiconductor device is on a top surface of the first ILD layer. The semiconductor device comprises a first doping-type wire, a second doping-type wire overlying the first doping-type wire, and a gate electrode straddling the first and second doping-type wires. The first and second doping-type wires are semiconductor materials with opposite doping types. Further, the first and second doping-type wires are devoid semiconductor junctions and doping concentration gradients.

Further yet, other embodiments of the present application provide another method for manufacturing an IC. A first ILD layer is formed on a semiconductor substrate, while also forming first vias and first interconnect wires alternatingly stacked in the first ILD layer. A first doping-type layer and a second doping-type layer are formed on a remote substrate remote from the semiconductor substrate. The first and second doping-type layers are stacked and are semiconductor materials with opposite doping types. The remote substrate is bonded to a top surface of the first ILD layer through the first and second doping-type layers. The remote substrate is removed from the first ILD layer while leaving the first and second doping-type layers on the first ILD layer. The first and second doping-type layers are patterned to form a first doping-type wire and a second doping-type wire covering the first doping-type wire. A gate electrode is formed straddling the first and second doping-type wires to define a semiconductor device. Second vias and second interconnect wires are formed over the semiconductor device, on the first ILD layer. The second doping-type wire is devoid of semiconductor junctions and doping concentration gradients at the time the second vias and the second interconnect wires are formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
a semiconductor substrate;
a first interlayer dielectric layer (ILD) layer covering the semiconductor substrate;
first vias and first interconnect wires alternatingly stacked within the first ILD layer;
a semiconductor device on a top surface of the first ILD layer, wherein the semiconductor device comprises a first doping-type wire, a second doping-type wire overlying the first doping-type wire, and a gate electrode straddling the first and second doping-type wires, wherein the first and second doping-type wires are semiconductor materials with opposite doping types, and wherein the first and second doping-type wires are devoid of semiconductor junctions and doping concentration gradients; and
an additional semiconductor device on the top surface of the first ILD layer, wherein the additional semiconductor device comprises another first doping-type wire, and further comprises another gate electrode straddling the other first doping-type wire, and wherein a topmost surface of the other gate electrode is spaced below a topmost surface of the gate electrode.

2. The IC according to claim 1, further comprising:
a second ILD layer covering the semiconductor device; and
second vias and second interconnect wires alternatingly stacked within the second ILD layer, wherein at least one of the second vias contacts the semiconductor device.

3. The IC according to claim 2, further comprising:
another additional semiconductor device over and in the semiconductor substrate; wherein at least one of the first vias contacts the other additional semiconductor device, and wherein a via extends continuously from contact with one of the second interconnect wires to contact with one of the first interconnect wires to electrically couple the other additional semiconductor device to the semiconductor device.

4. The IC according to claim 1, wherein a two-dimensional (2D) projection of the first doping-type wire onto the top surface of the first ILD layer is different than that of the second doping-type wire.

5. The IC according to claim 1, wherein the first doping-type wire has a different thickness than that of the second doping-type wire.

6. The IC according to claim 1, wherein the first doping-type wire contacts the top surface of the first ILD layer, and wherein the second doping-type wire contacts a top surface of the first doping-type wire.

7. The IC according to claim 1, wherein the first and second doping-type wires are laterally elongated, and wherein the gate electrode straddles the first and second doping-type wires and is laterally spaced from ends of the first and second doping-type wires.

8. The IC according to claim 1, wherein the semiconductor device further comprises a gate dielectric layer lining and contacting a top surface of the second doping-type wire, and further lining and contacting sidewalls of the first and second doping-type wires, and wherein the gate electrode is over and contacts the gate dielectric layer.

9. The IC according to claim 1, wherein the another first doping-type wire is devoid of semiconductor junctions and doping concentration gradients.

10. The IC according to claim 1, wherein a two-dimensional (2D) projection of the first doping-type wire onto the top surface of the first ILD layer is different than that of the other first doping-type wire.

11. An integrated circuit (IC) comprising:
a semiconductor substrate;
an interlayer dielectric layer (ILD) layer covering the semiconductor substrate;
a plurality of vias and a plurality of metal wires alternatingly stacked in the ILD layer, wherein the plurality of metal wires comprises a lower metal wire and an upper metal wire;
a first semiconductor wire and a second semiconductor wire in the ILD layer, wherein the first and second semiconductor wires are laterally elongated in parallel and are laterally spaced from each other, wherein the first and second semiconductor wires are elevated above the lower metal wire and are recessed below the upper metal wire, wherein the first and second semiconductor wires have different elevations above the semiconductor substrate, and wherein the first and second semiconductor wires each consists of a single doping type; and
a gate electrode partially covering the first and second semiconductor wires in the ILD layer and having a bottom wrapping individually around a top of the first semiconductor wire and a top of the second semiconductor wire.

12. The IC according to claim 11, wherein the bottom of the gate electrode has an inverted U-shaped profile at each of the first and second semiconductor wires.

13. The IC according to claim 11, wherein a top of the gate electrode has a U-shaped profile laterally and directly between the first and second semiconductor wires.

14. The IC according to claim 11, wherein the first and second semiconductor wires have opposite doping types.

15. The IC according to claim 11, further comprising:
a third semiconductor wire underlying an entirety of the first semiconductor wire and laterally elongated in parallel with the first and second semiconductor wires, wherein the third semiconductor wire consists of a single doping type opposite that of the first semiconductor wire, and wherein the bottom of the gate electrode wraps around a top of the third semiconductor wire and extends along a sidewall of the third semiconductor wire to below the top of the third semiconductor wire.

16. The IC according to claim 11, further comprising:
a gate dielectric layer between the first and second semiconductor wires and the gate electrode, wherein the gate dielectric layer extends from direct contact with individual sidewalls of the first and second semiconductor wires to the bottom of the gate electrode, and wherein the gate dielectric layer extends from direct contact with individual top surfaces of the first and second semiconductor wires to the bottom of the gate electrode.

17. An integrated circuit (IC) comprising:
a semiconductor substrate;
an interlayer dielectric layer (ILD) layer covering the semiconductor substrate;
a first semiconductor wire in the ILD layer;
a first gate electrode overlying and straddling the first semiconductor wire in the ILD layer, wherein the first semiconductor wire is devoid of PN junctions and is inset into a bottom of the first gate electrode, and wherein the first gate electrode and the first semiconductor wire at least partially define a first junctionless semiconductor device (JSD);
a plurality of vias and a plurality of metal wires alternatingly stacked in the ILD layer, wherein the plurality of metal wires comprises a lower metal wire recessed below the first JSD and a continuous upper metal wire elevated above the first JSD, wherein the plurality of vias comprises an interconnect via and a through device via (TDV), wherein the TDV extends from the continuous upper metal wire to the lower metal wire, and wherein the interconnect via extends from the continuous upper metal wire to the first JSD;
a second semiconductor wire in the ILD layer;
a second gate electrode independent of the first gate electrode and overlying the second semiconductor wire in the ILD layer, wherein the second gate electrode and the second semiconductor wire at least partially define a second JSD; and
a gate dielectric layer extending continuously from the first JSD to the second JSD and separating the first and second gate electrodes from the first and second semiconductor wires.

18. The IC according to claim 17, further comprising:
a third semiconductor wire completely underlying and directly contacting the first semiconductor wire, wherein the third semiconductor wire consists essentially of a single doping type opposite that of the first semiconductor wire, and wherein the bottom of the first gate electrode has an inverted U-shaped profile straddling the first and third semiconductor wires and extending from over a top surface of the first semiconductor wire to below a top surface of the third semiconductor wire.

19. The IC according to claim 18, wherein the first and third semiconductor wires have a same top layout that is rectangular.

20. The IC according to claim 17, wherein the gate dielectric layer comprises silicon dioxide.

* * * * *